US012795837B2

(12) United States Patent
Okubo

(10) Patent No.: US 12,795,837 B2
(45) Date of Patent: Nov. 10, 2026

(54) SEMICONDUCTOR STORAGE DEVICE

(71) Applicant: Kioxia Corporation, Tokyo (JP)

(72) Inventor: Rei Okubo, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 147 days.

(21) Appl. No.: 18/959,785

(22) Filed: Nov. 26, 2024

(65) Prior Publication Data

US 2025/0220828 A1 Jul. 3, 2025

(30) Foreign Application Priority Data

Dec. 28, 2023 (JP) ................................ 2023-223103

(51) Int. Cl.
*H05K 5/00* (2025.01)

(52) U.S. Cl.
CPC .................................. *H05K 5/006* (2013.01)

(58) Field of Classification Search
CPC ..................................................... H05K 5/006
See application file for complete search history.

(56) References Cited

U.S. PATENT DOCUMENTS

| | | | | |
|---|---|---|---|---|
| 8,480,186 | B2 | 7/2013 | Wang | |
| 9,386,720 | B2 | 7/2016 | Yang et al. | |
| 10,346,735 | B1 * | 7/2019 | Lee | G06F 1/00 |
| 2006/0103272 | A1 | 5/2006 | Chen et al. | |
| 2020/0259939 | A1 * | 8/2020 | Yan | H05K 5/0221 |

* cited by examiner

*Primary Examiner* — Jerry Wu
(74) *Attorney, Agent, or Firm* — Maier & Maier, PLLC

(57) ABSTRACT

A semiconductor storage device according to one embodiment includes a housing having a housing space, a board disposed in the housing space and having a first surface, and a semiconductor memory provided on the first surface.

20 Claims, 18 Drawing Sheets

SEMICONDUCTOR STORAGE DEVICE

CROSS-REFERENCE TO RELATED APPLICATION

This application is based upon and claims the benefit of priority from Japanese Patent Application No. 2023-223103 filed on Dec. 28, 2023; the entire contents of which are incorporated herein by reference.

FIELD

An embodiment of the present invention relates to a semiconductor storage device.

BACKGROUND ART

A semiconductor storage device having a housing, a board disposed inside the housing, and a semiconductor memory provided on the board is known.

DETAILED DESCRIPTION

Figure 1:
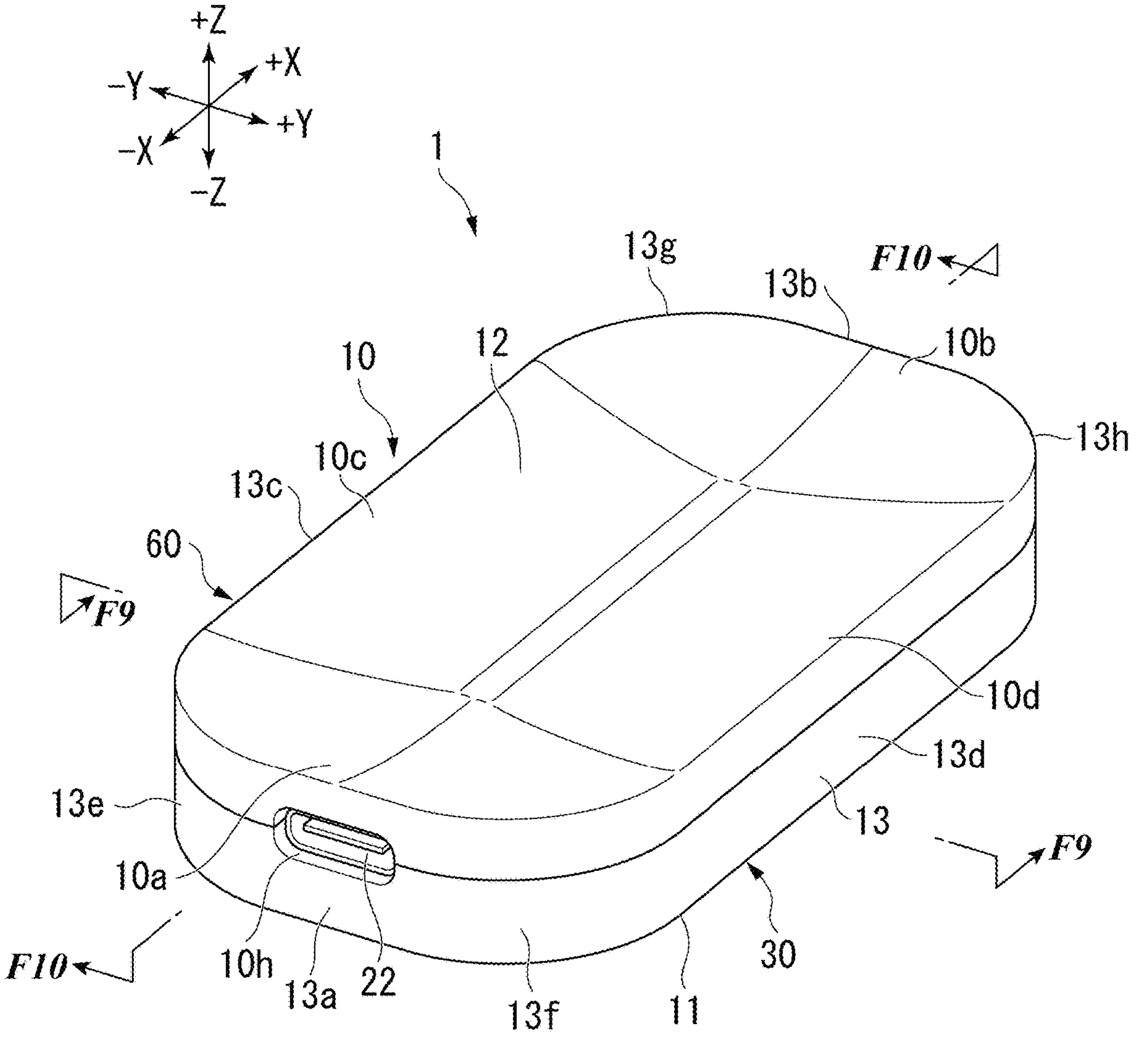
FIG. 1 is a perspective view showing a semiconductor storage device according to a first embodiment.

A semiconductor storage device according to one embodiment includes a housing, a board, and a semiconductor memory. The housing has a housing space. The board is in the housing space. The board has a first surface. The semiconductor memory is on the first surface. The housing includes a first member and a second member. The second member is combined with the first member. The housing space is between the first member and the second member. The first member includes an engagement portion and a first fixing portion. The engagement portion is inside the housing. The engagement portion includes a first portion and a second portion. The first portion extends in a thickness direction of the board. The second portion extends from the first portion in a first direction along the first surface. A fastening member is attached to the first fixing portion. The second member includes a receiving portion and a second fixing portion. The receiving portion includes an insertion space. The insertion space is opened in a second direction opposite to the first direction. The receiving portion engages with the engagement portion when the second member moves in the second direction with respect to the first member and the second portion is thereby inserted into the insertion space. The second fixing portion is fixed to the first fixing portion by the fastening member in a state in which the engagement portion and the receiving portion are engaged with each other.

Hereinafter, a semiconductor storage device according to an embodiment will be described with reference to the drawings. In the following description, components having the same or similar functions are denoted by the same reference signs. Also, duplicate description of the components may be omitted. In the present application, “parallel”, “orthogonal”, or “the same” may include a case of “substantially parallel”, “substantially orthogonal”, or “substantially the same”. “Connection” in the present application is not limited to a case of being mechanically connected, and may also include a case of being electrically connected. That is, “connection” is not limited to a case of being directly connected to an object, and may include a case of being connected to the object with another member interposed therebetween.

In the present application, a +X direction, a −X direction, a +Y direction, a −Y direction, a +Z direction, and a −Z direction are defined as follows. The +X direction, the −X direction, the +Y direction, and the −Y direction are directions parallel to a first surface 21*a* of a board 21 (see FIG. 2) to be described later. The +X direction is a direction from a first end part 10*a* toward a second end part 10*b* of a housing 10 to be described later (see FIG. 1). The −X direction is a direction opposite to the +X direction. In a case in which the +X direction and the −X direction do not need to be distinguished from each other, they will be simply referred to as “X direction”. The +Y direction and the −Y direction are directions intersecting (for example, orthogonal to) the X direction. The +Y direction is a direction from a third end part 10*c* to a fourth end part 10*d* of the housing 10 to be described later (see FIG. 1). The −Y direction is a direction opposite to the +Y direction. In a case in which the +Y direction and the −Y direction do not need to be distinguished from each other, they will be simply referred to as "Y direction".

The +Z direction and the −Z direction are directions intersecting (for example, orthogonal to) the X direction and the Y direction. The +Z and −Z directions are thickness directions of the board 21. The +Z direction is a direction from a first main wall 11 to a second main wall 12 of the housing 10 (see FIG. 1). The −Z direction is a direction opposite to the +Z direction. In a case in which the +Z direction and the −Z direction do not need to be distinguished from each other, they will be simply referred to as "Z direction". Hereinafter, the side in the −Z direction may be referred to as "lower" and on the side in the +Z direction may be referred to as "upper". However, these expressions are used for convenience of explanation and do not define the direction of gravity. The −X direction is an example of a "first direction". The +X direction is an example of a "second direction". The Y direction is an example of a "third direction".

First Embodiment

1. Overall Configuration of Semiconductor Storage Device

A semiconductor storage device 1 according to a first embodiment will be described with reference to FIGS. 1 to 12B. The semiconductor storage device 1 is a storage device such as, for example, a solid state drive (SSD). The semiconductor storage device 1 is connected to a host device. The semiconductor storage device 1 is used as a storage device of the host device. The host device may be a personal computer, a mobile device, a video recorder, an in-vehicle device, or the like, but is not limited to these examples.

FIG. 1 is a perspective view showing the semiconductor storage device 1. The semiconductor storage device 1 includes, for example, the housing 10 and a board unit 20 (see FIG. 2).

<1.1 Housing>

The housing 10 is a member that forms an outer shell of the semiconductor storage device 1. The housing 10 has, for example, a flat box shape. The housing 10 has the first end part 10*a*, the second end part 10*b*, the third end part 10*c*, and the fourth end part 10*d*. The first end part 10*a* and the second end part 10*b* are a pair of end parts separated in a longitudinal direction (X direction) of the housing 10. The third end part 10*c* and the fourth end part 10*d* are a pair of end parts separated in a transverse direction (Y direction) of the housing 10.

The housing 10 has the first main wall 11, the second main wall 12, and a circumferential wall 13. The first main wall 11, the second main wall 12, and the circumferential wall 13 are exposed to the outside of the housing 10. The first main wall 11, the second main wall 12, and the circumferential wall 13 are wall portions that define an outer shape of the housing 10.

(First Main Wall)

The first main wall 11 is a wall portion facing the board unit 20 from the side in the −Z direction. The first main wall 11 is curved to be recessed toward the inside of the housing 10, for example, to improve a design, enhance rigidity, or for other purposes (see FIG. 10). Note that, the first main wall 11 may be a flat wall extending in the X direction and the Y direction.

(Second Main Wall)

The second main wall 12 is a wall portion facing the board unit 20 from the side in the +Z direction. The second main wall 12 is curved to be recessed toward the inside of the housing 10, for example, to improve a design, enhance rigidity, or for other purposes (see FIG. 10). Note that, the second main wall 12 may be a flat wall extending in the X direction and the Y direction.

(Circumferential Wall)

The circumferential wall 13 is an annular wall portion surrounding a circumference of the board unit 20. The circumferential wall 13 extends in the Z direction. The circumferential wall 13 connects a circumferential end part of the first main wall 11 and a circumferential end part of the second main wall 12. The circumferential wall 13 includes, for example, a first end wall 13*a*, a second end wall 13*b*, a first side wall 13*c*, a second side wall 13*d*, a first curved wall 13*e*, a second curved wall 13*f*, a third curved wall 13*g*, and a fourth curved wall 13*h*.

The first end wall 13*a* is positioned at the first end part 10*a* of the housing 10. The first end wall 13*a* is positioned on the side in the −X direction with respect to the board unit 20. The first end wall 13*a* is, for example, a flat wall extending in the Y direction and the Z direction. The first end wall 13*a* has an opening 10*h*. The opening 10*h* penetrates the first end wall 13*a* in the Y direction. The opening 10*h* exposes a connection connector 22 of the board unit 20 to be described later to the outside of the housing 10. The second end wall 13*b* is positioned at the second end part 10*b* of the housing 10. The second end wall 13*b* is positioned on the side in the +X direction with respect to the board unit 20. The second end wall 13*b* is, for example, a flat wall extending in the Y direction and the Z direction.

The first side wall 13*c* is positioned at a third end part 10*c* of the housing 10. The first side wall 13*c* is positioned on the side in the −Y direction with respect to the board unit 20. The first side wall 13*c* is, for example, a flat wall extending in the X direction and the Z direction. The second side wall 13*d* is positioned at the fourth end part 10*d* of the housing 10. The second side wall 13*d* is positioned on the side in the +Y direction with respect to the board unit 20. The second side wall 13*d* is, for example, a flat wall extending in the X direction and the Z direction.

Each of the first curved wall 13*e*, the second curved wall 13*f*, the third curved wall 13*g*, and the fourth curved wall 13*h* is an arc-shaped wall portion that protrudes toward the outside of the housing 10. The first curved wall 13*e* is positioned between the first end wall 13*a* and the first side wall 13*c*. The first curved wall 13*e* connects the first end wall 13*a* and the first side wall 13*c*. The second curved wall 13*f* is positioned between the first end wall 13*a* and the second side wall 13*d*. The second curved wall 13*f* connects the first end wall 13*a* and the second side wall 13*d*. The third curved wall 13*g* is positioned between the second end wall 13*b* and the first side wall 13*c*. The third curved wall 13*g* connects the second end wall 13*b* and the first side wall 13*c*. The fourth curved wall 13*h* is positioned between the second end wall 13*b* and the second side wall 13*d*. The fourth curved wall 13*h* connects the second end wall 13*b* and the second side wall 13*d*.

Figure 2:
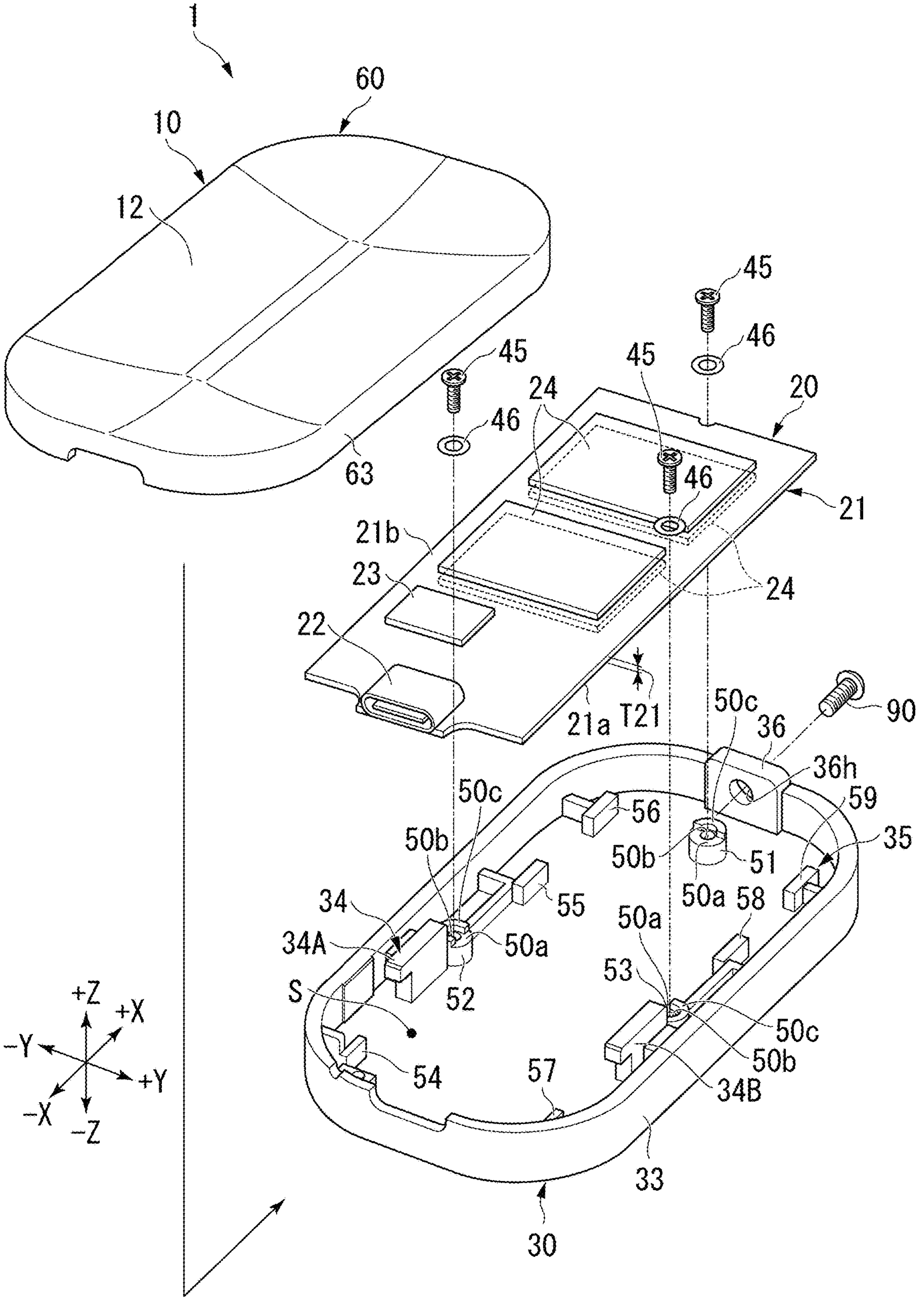
FIG. 2 is a partially-exploded perspective view showing the semiconductor storage device according to the first embodiment.

FIG. 2 is a partially-exploded perspective view showing the semiconductor storage device 1. The housing 10 has, for example, a base 30 and a cover 60. In the present embodiment, the housing 10 is formed by combining the base 30 and the cover 60. When the base 30 and the cover 60 are combined, a housing space S is formed between the base 30 and the cover 60. The housing space S serves as an internal space of the housing 10. Note that, details of the base 30 and the cover 60 will be described later. The base 30 is an example of a "first member". The cover 60 is an example of a "second member".

<1.2 Board Unit>

Next, the board unit 20 will be described.

The board unit 20 is disposed in the housing space S of the housing 10. The board unit 20 includes, for example, the board 21, the connection connector 22, a controller 23, and a plurality of NAND flash memories 24 (hereinafter, referred to as "NANDs 24").

The board 21 is a plate member extending in the X direction and the Y direction. The board 21 is a printed circuit board. The board 21 includes an insulating base member and a wiring pattern provided on the insulating base member. The board 21 has the first surface 21*a* and a second surface 21*b*. The second surface 21*b* is positioned on the side opposite to the first surface 21*a*. The first surface 21*a* extends in the X direction and the Y direction. The first surface 21*a* faces the −Z direction. The second surface 21*b* extends in the X direction and the Y direction. The second surface 21*b* faces the +Z direction.

The connection connector 22 is a connection portion that can be connected to a connector of the host device. The connection connector 22 includes a plurality of metal terminals that can be connected to a connector of the host device. The connection connector 22 is provided, for example, on the second surface 21*b* of the board 21. The connection connector 22 is exposed to the outside of the housing 10 through the opening 10*h* of the housing 10 (see FIG. 1).

The controller 23 is a component that comprehensively controls the entirety of the semiconductor storage device 1. The controller 23 is a semiconductor package. Such a semiconductor package includes a system on a system on a chip (SoC). In the system on a chip, for example, a host interface circuit for the host device, a control circuit configured to control the plurality of NANDs 24, and the like are integrated into one semiconductor chip. The controller 23 is provided, for example, on the second surface 21*b* of the board 21.

The controller 23 may include a dynamic random access memory (DRAM). The DRAM is a data buffer. In the data buffer, write target data received from the host device, read target data read from the NAND 24, or the like is to be temporarily stored. Note that, the DRAM may be provided on the board 21 as a separate part from the controller 23 instead of being provided inside the controller 23.

The NAND 24 is a semiconductor package that includes a nonvolatile semiconductor memory chip. The NAND 24 is provided, for example, on the first surface 21*a* and the second surface 21*b* of the board 21. The plurality of NANDs 24 are disposed to be aligned in the X direction. The NAND 24 is an example of a "semiconductor memory". Note that, the "semiconductor memory as used in the present application is not limited to the NAND 24, and may be other types of semiconductor memory such as a NOR type memory, a magnetoresistive random access memory (MRAM), a resistive memory, or the like.

2. Structure of Base

Next, a structure of the base 30 will be described.

Figure 3:
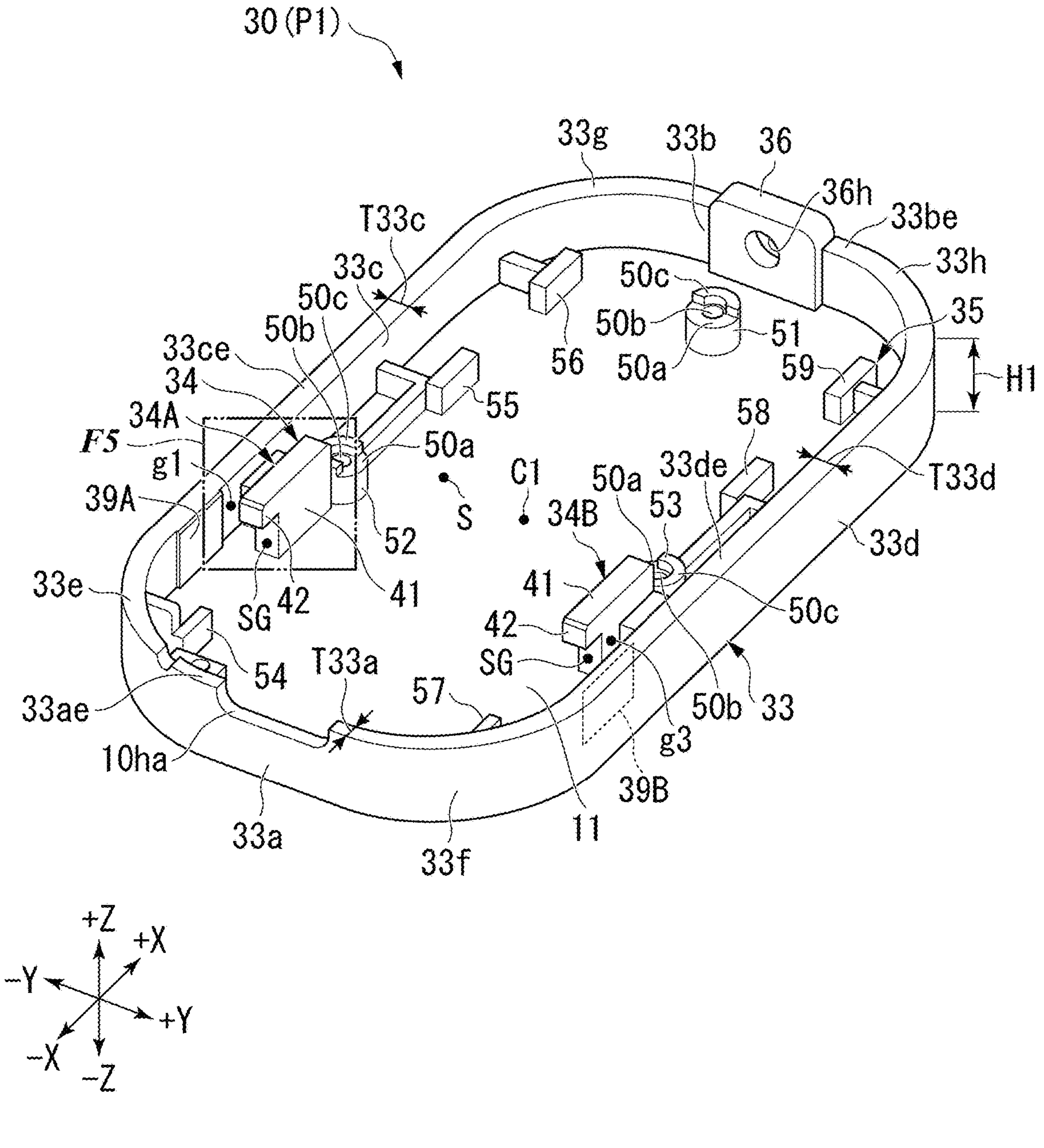
FIG. 3 is a perspective view showing a base according to the first embodiment.

FIG. 3 is a perspective view showing the base 30. The base 30 has, for example, the first main wall 11, a circumferential wall 33, an engagement portion 34, a board support portion 35, and a fixing portion 36. Since the first main wall 11 has been described above, duplicate description will be omitted here.

In the present embodiment, the base 30 is a single-piece metal part P1 that is integrally molded by die casting. For example, the first main wall 11, the circumferential wall 33, the engagement portion 34, the board support portion 35, and the fixing portion 36 are integrally molded as the single-piece metal part P1. The metal part P1 is an example of a "first part". The base 30 is molded by, for example, aluminum die casting, but may be molded by die casting using another metal material.

<2.1 Circumferential Wall>

First, the circumferential wall 33 will be described. The circumferential wall 33 is a wall portion that forms a part of the circumferential wall 13 of the housing 10 described above. The circumferential wall 33 includes, for example, a first end wall 33*a*, a second end wall 33*b*, a first side wall 33*c*, a second side wall 33*d*, a first curved wall 33*e*, a second curved wall 33*f*, a third curved wall 33*g*, and a fourth curved wall 33*h*. Heights H1 in the Z direction of the first end wall 33*a*, the second end wall 33*b*, the first side wall 33*c*, the second side wall 33*d*, the first curved wall 33*e*, the second curved wall 33*f*, the third curved wall 33*g*, and the fourth curved wall 33*h* are, for example, the same as each other.

(First End Wall)

The first end wall 33*a* is an upright wall extending in the +Z direction from an end part of the first main wall 11 on the side in the −X direction. The first end wall 33*a* is, for example, a flat wall extending in the Y direction and the Z direction. The first end wall 33*a* forms a part of the first end wall 13*a* of the housing 10 described above. The first end wall 33*a* has, for example, a lower half 10*ha* of the opening 10*h*.

(Second End Wall)

The second end wall 33*b* is an upright wall extending in the +Z direction from an end part of the first main wall 11 on the side in the +X direction. The second end wall 33*b* is, for example, a flat wall extending in the Y direction and the Z direction. The second end wall 33*b* forms a part of the second end wall 13*b* of the housing 10 described above.

(First Side Wall)

The first side wall 33*c* is an upright wall extending in the +Z direction from an end part of the first main wall 11 on the side in the −Y direction. The first side wall 33*c* is, for example, a flat wall extending in the X direction and the Z direction. The first side wall 33*c* forms a part of the first side wall 13*c* of the housing 10 described above. In the present embodiment, a thickness T33*c* of the first side wall 33*c* in the Y direction is larger than the thickness T33*a* of the first end wall 33*a* in the X direction. From another perspective, the thickness T33*c* of the first side wall 33*c* in the Y direction is larger than the thickness T21 of the board 21 in the Z direction (see FIG. 2).

In the present embodiment, the first side wall 33*c* has a guide surface 39A exposed to the housing space S. The guide surface 39A is a flat surface extending in the X direction and the Z direction. The guide surface 39A guides sliding of a first receiving portion 64A of the cover 60, which will be described later, in the X direction.

(Second Side Wall)

The second side wall 33*d* is an upright wall extending in the +Z direction from an end part of the first main wall 11 on the side in the +Y direction. The second side wall 33*d* is, for example, a flat wall extending in the X direction and the Z direction. The second side wall 33*d* forms a part of the second side wall 13*d* of the housing 10 described above. In the present embodiment, the thickness T33*d* of the second side wall 33*d* in the Y direction is larger than the thickness T33*a* of the first end wall 33*a* in the X direction. From another perspective, the thickness T33*d* of the second side wall 33*d* in the Y direction is larger than the thickness T21 of the board 21 in the Z direction (see FIG. 2).

In the present embodiment, the second side wall 33*d* has a guide surface 39B exposed to the housing space S. The guide surface 39B is a flat surface extending in the X direction and the Z direction. The guide surface 39B guides sliding of a second receiving portion 64B of the cover 60, which will be described later, in the X direction.

(First Curved Wall, Second Curved Wall, Third Curved Wall, and Fourth Curved Wall)

Each of the first curved wall 33*e*, the second curved wall 33*f*, the third curved wall 33*g*, and the fourth curved wall 33*h* is an upright wall extending from an end part of the first main wall 11 in the +Z direction. Each of the first curved wall 33*e*, the second curved wall 33*f*, the third curved wall 33*g*, and the fourth curved wall 33*h* is an arc-shaped wall portion that protrudes toward the outside of the housing 10.

The first curved wall 33*e* is positioned between the first end wall 33*a* and the first side wall 33*c*. The first curved wall 33*e* connects the first end wall 33*a* and the first side wall 33*c*. The first curved wall 33*e* forms a part of the first curved wall 13*e* of the housing 10 described above.

The second curved wall 33*f* is positioned between the first end wall 33*a* and the second side wall 33*d*. The second curved wall 33*f* connects the first end wall 33*a* and the second side wall 33*d*. The second curved wall 33*f* forms a part of the second curved wall 13*f* of the housing 10 described above.

The third curved wall 33*g* is positioned between the second end wall 33*b* and the first side wall 33*c*. The third curved wall 33*g* connects the second end wall 33*b* and the first side wall 33*c*. The third curved wall 33*g* forms a part of the third curved wall 13*g* of the housing 10 described above.

The fourth curved wall 33*h* is positioned between the second end wall 33*b* and the second side wall 33*d*. The fourth curved wall 33*h* connects the second end wall 33*b* and the second side wall 33*d*. The fourth curved wall 33*h* forms a part of the fourth curved wall 13*h* of the housing 10 described above.

<2.2 Engagement Portion>

Next, the engagement portion 34 will be described. The engagement portion 34 is a portion that engages with a receiving portion 64 of the cover 60 to be described later. The engagement portion 34 is disposed inside the housing 10. For example, the engagement portion 34 is provided on the first main wall 11. The engagement portion 34 protrudes from the first main wall 11 to the housing space S. Note that, in the present application, "disposed inside the housing" is not limited to being disposed apart from the circumferential wall 13 of the housing 10 (for example, the circumferential wall 33 of the base 30), but may also include being formed integrally with an inner surface of the circumferential wall 13 of the housing 10 (for example, the circumferential wall 33 of the base 30).

(Disposition Position of Engagement Portion)

In the present embodiment, the engagement portion 34 includes a plurality of engagement portions 34A and 34B (a first engagement portion 34A and a second engagement portion 34B). The plurality of engagement portions 34A and 34B are positioned, for example, displaced to the side in the −X direction with respect to a center C1 of the first main wall 11 in the X direction.

Figure 4:
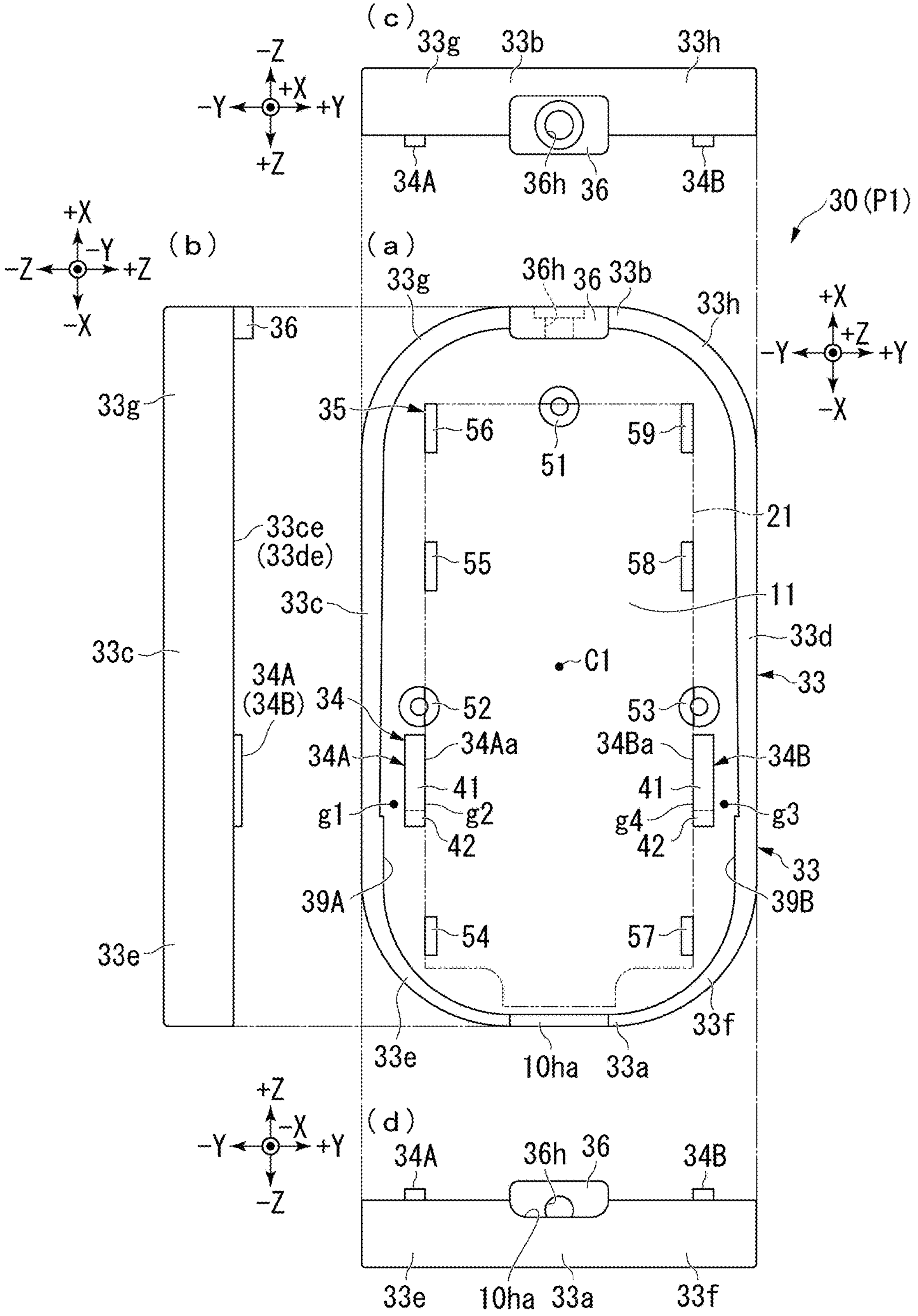
FIG. 4 is a view showing the base according to the first embodiment.

FIG. 4 is a view showing the base 30. PART (a) of FIG. 4 shows the base 30 when viewed from the side in the +Z direction. PART (b) of FIG. 4 shows the base 30 when viewed from the side in the −Y direction. PART (c) of FIG. 4 shows the base 30 when viewed from the side in the +X direction. PART (d) of FIG. 4 shows the base 30 when viewed from the side in the −X direction. In the present embodiment, the first engagement portion 34A is disposed apart from the first side wall 33*c* and the second side wall 33*d*. When viewed from the Z direction, the first engagement portion 34A is disposed between the board 21 and the first side wall 33*c*. A first gap g1 is provided between the first engagement portion 34A and the first side wall 33*c*.

In the present embodiment, the first engagement portion 34A is disposed along an end part of the board 21 on the side in the −Y direction. A second gap g2 may be present between the first engagement portion 34A and the board 21. A width of the second gap g2 in the Y direction is substantially zero or is smaller than the width of the first gap g1 in the Y direction. The board 21 can be aligned in position in the Y direction, for example, with a side surface 34Aa of the first engagement portion 34A on the side in the +Y direction as a guide.

Similarly, the second engagement portion 34B is disposed apart from the first side wall 33*c* and the second side wall 33*d*. The second engagement portion 34B is disposed between the board 21 and the second side wall 33*d* when viewed from the Z direction. A third gap g3 is provided between the second engagement portion 34B and the second side wall 33*d*.

In the present embodiment, the second engagement portion 34B is disposed along an end part of the board 21 on the side in the +Y direction. A fourth gap g4 may be present between the second engagement portion 34B and the board 21. A width of the fourth gap g4 in the Y direction is substantially zero or is smaller than the width of the third gap g3 in the Y direction. The board 21 can be aligned in position, for example, with a side surface 34Ba of the second engagement portion 34B on the side in the −Y direction as a guide.

(Shape of Engagement Portion)

In the present embodiment, the plurality of engagement portions 34A and 34B have the same shape as each other. Therefore, in the following, a shape of the first engagement portion 34A will be described as a representative example. In the description of the first engagement portion 34A below, a shape of the second engagement portion 34B may be understood by replacing "an upper end surface 33*ce* of the first side wall 33*c*" with "an upper end surface 33*de* of the second side wall 33*d*".

Figure 5:
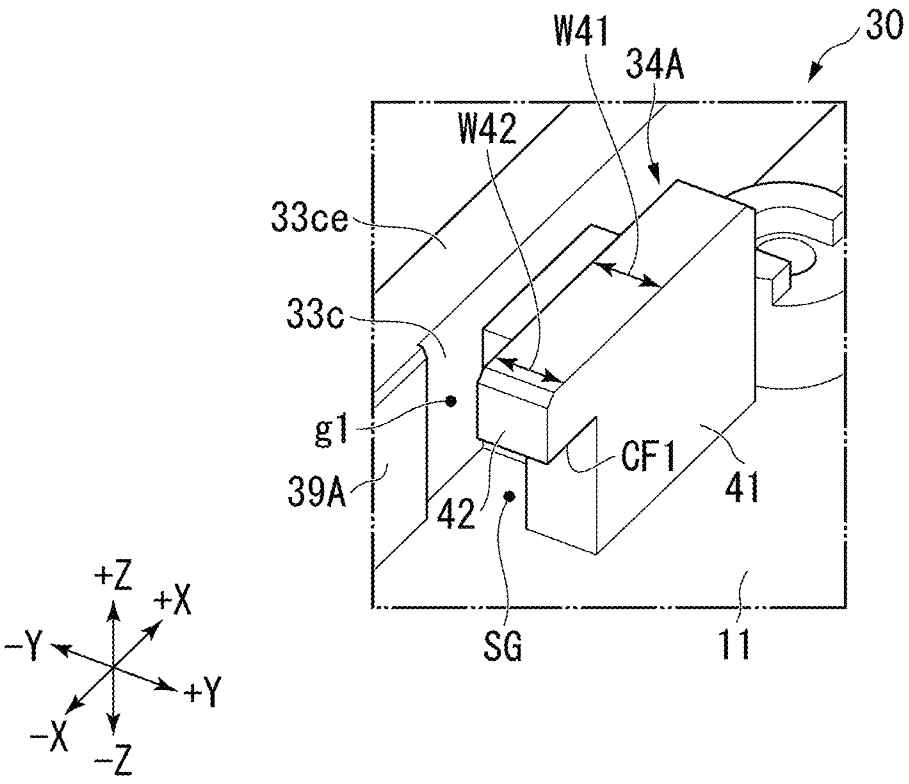
FIG. 5 is an enlarged perspective view showing a region surrounded by the dashed dotted line F5 shown in FIG. 3.

FIG. 5 is an enlarged perspective view showing a region surrounded by the dashed dotted line F5 shown in FIG. 3. The engagement portion 34A has, for example, a base portion 41 and a protruding portion 42. The base portion 41 is an example of a "first portion". The protruding portion 42 is an example of a "second portion".

The base portion 41 extends in the +Z direction from the first main wall 11. The base portion 41 is a plate portion extending in the X direction and the Y direction. In the present embodiment, the base portion 41 extends to on the side in the +Z direction beyond an upper end surface 33*ce* (a boundary portion B between the base 30 and the cover 60) of the first side wall 33*c* (see FIG. 10).

The protruding portion 42 protrudes in the −X direction from an end part of the base portion 41 on the side in the +Z direction. A space SG is provided between the protruding portion 42 and the first main wall 11. In the present embodiment, at least a part of the protruding portion 42 is disposed closer to the second main wall 12 of the cover 60 than the upper end surface 33*ce* (the boundary portion B between the base 30 and the cover 60) of the first side wall 33*c*. A shortest distance between at least a part of the protruding portion 42 and the second main wall 12 is smaller than the shortest distance between the upper end surface 33*ce* (the boundary portion B between the base 30 and the cover 60) of the first side wall 33*c* and the second main wall 12.

In the present embodiment, the protruding portion 42 extends in the −X direction from the end part of the base portion 41 on the side in the +Z direction at a position apart from the first side wall 33*c* and the second side wall 33*d*. A width W42 of the protruding portion 42 in the Y direction is the same as a width W41 of the base portion 41 in the Y direction. A lower surface of the protruding portion 42 has a first contact portion CF1 that comes into contact with the receiving portion 64 of the cover 60 to be described later. In the present embodiment, the first contact portion CF1 is a contact surface provided as a part of the lower surface of the protruding portion 42. The first contact portion CF1 is, for example, a flat surface extending in the X direction and the Y direction.

<2.3 Board Support Portion>

Returning to FIG. 2, the board support portion 35 will be described. The board support portion 35 is a support portion that supports the board 21 inside the housing 10. The board support portion 35 has, for example, a first support portion 51, a second support portion 52, a third support portion 53, a fourth support portion 54, a fifth support portion 55, a sixth support portion 56, a seventh support portion 57, an eighth support portion 58, and a ninth support portion 59. Each of the first support portion 51, the second support portion 52, and the third support portion 53 is a portion to which a screw member 45 is attached. Each of the fourth support portion 54, the fifth support portion 55, the sixth support portion 56, the seventh support portion 57, the eighth support portion 58, and the ninth support portion 59 is a portion to which the screw member 45 cannot be attached.

(First Support Portion)

The first support portion 51 is a protruding portion that protrudes in the +Z direction from the first main wall 11. The first support portion 51 is disposed at a position overlapping a part of an end part of the board 21 on the side in the +X direction when viewed from the Z direction. The first support portion 51 has, for example, a placement surface 50*a*, an engagement hole 50*b*, and a position restriction portion 50*c*.

The placement surface 50*a* is a flat surface extending in the X direction and the Y direction. The first surface 21*a* of the board 21 is placed on the placement surface 50*a*.

The engagement hole 50*b* opens to the placement surface 50*a*. The engagement hole 50*b* extends the inside of the first support portion 51 in the Z direction. An inner circumferential surface of the engagement hole 50*b* has, for example, a female thread. The screw member 45 is engaged with the engagement hole 50*b*, for example, with a washer 46 interposed therebetween. The screw member 45 presses the board 21 toward the placement surface 50*a*, for example, via the washer 46.

The position restriction portion 50*c* is positioned on the side in the +X direction of the placement surface 50*a*. The position restriction portion 50*c* protrudes in the +Z direction with respect to the placement surface 50*a*. The position restriction portion 50*c* is formed in an arc shape to avoid, for example, the engagement hole 50*b*. The position restriction portion 50*c* is a portion facing the board 21, which is placed on the placement surface 50*a*, from the side in the +X direction. The position restriction portion 50*c* restricts a position of the board 21 in the +X direction.

(Second Support Portion)

The second support portion 52 is a protruding portion that protrudes from the first main wall 11 in the +Z direction. The second support portion 52 is disposed at a position overlapping a part of the end part of the board 21 on the side in the −Y direction when viewed from the Z direction. Similarly to the first support portion 51, the second support portion 52 includes the placement surface 50*a*, the engagement hole 50*b*, and the position restriction portion 50*c*. Details of the second support portion 52 may be understood by replacing the "+X direction" with the "−Y direction" in the above-described description of the first support portion 51.

(Third Support Portion)

The third support portion 53 is a protruding portion that protrudes from the first main wall 11 in the +Z direction. The third support portion 53 is disposed at a position overlapping a part of the end part of the board 21 on the side in the +Y direction when viewed from the Z direction. Similarly to the first support portion 51, the third support portion 53 includes the placement surface 50*a*, the engagement hole 50*b*, and the position restriction portion 50*c*. Details of the third support portion 53 may be understood by replacing the "+X direction" with the "+Y direction" in the above-described description of the first support portion 51.

(Fourth Support Portion, Fifth Support Portion, Sixth Support Portion, Seventh Support Portion, Eighth Support Portion, and Ninth Support Portion)

Each of the fourth support portion 54, the fifth support portion 55, the sixth support portion 56, the seventh support portion 57, the eighth support portion 58, and the ninth support portion 59 is a protruding portion that protrudes from the first main wall 11 in the +Z direction. Each of the fourth support portion 54, the fifth support portion 55, and the sixth support portion 56 is disposed at a position overlapping the end part of the board 21 on the side in the −Y direction when viewed from the Z direction. The fourth support portion 54, the fifth support portion 55, and the sixth support portion 56 are separately disposed in the X direction. Each of the fourth support portion 54, the fifth support portion 55, and the sixth support portion 56 is in contact with the first surface 21*a* of the board 21 from the side in the −Z direction to support the board 21. The seventh support portion 57, the eighth support portion 58, and the ninth support portion 59 are disposed at positions overlapping the end part of the board 21 on the side in the +Y direction when viewed from the Z direction. The seventh support portion 57, the eighth support portion 58, and the ninth support portion 59 are separately disposed in the X direction. The seventh support portion 57, the eighth support portion 58, and the ninth support portion 59 are in contact with the first surface 21*a* of the board 21 from the side in the −Z direction to support the board 21.

<2.4 Fixing Portion>

The fixing portion 36 is a portion fixed to a fixing portion 66 of the cover 60 by a fastening member 90 to be described later. The fixing portion 36 is an example of a "first fixing portion". In the present embodiment, the fixing portion 36 is provided at the second end part 10*b* of the housing 10. For example, the fixing portion 36 is provided on the second end wall 33*b* of the base 30. The fixing portion 36 is exposed to the outside of the housing 10. The fixing portion 36 has an insertion hole 36*h* through which the fastening member 90 is inserted. The insertion hole 36*h* penetrates the fixing portion 36 in the X direction. The fastening member 90 is attached to the fixing portion 36. Note that, in the present application, "the fastening member is attached" is not limited to a case in which the fastening member is fixed, and also includes a case in which the fastening member is inserted through the insertion hole, or the like.

3. Structure of Cover

Next, a structure of the cover 60 will be described.

Figure 6:
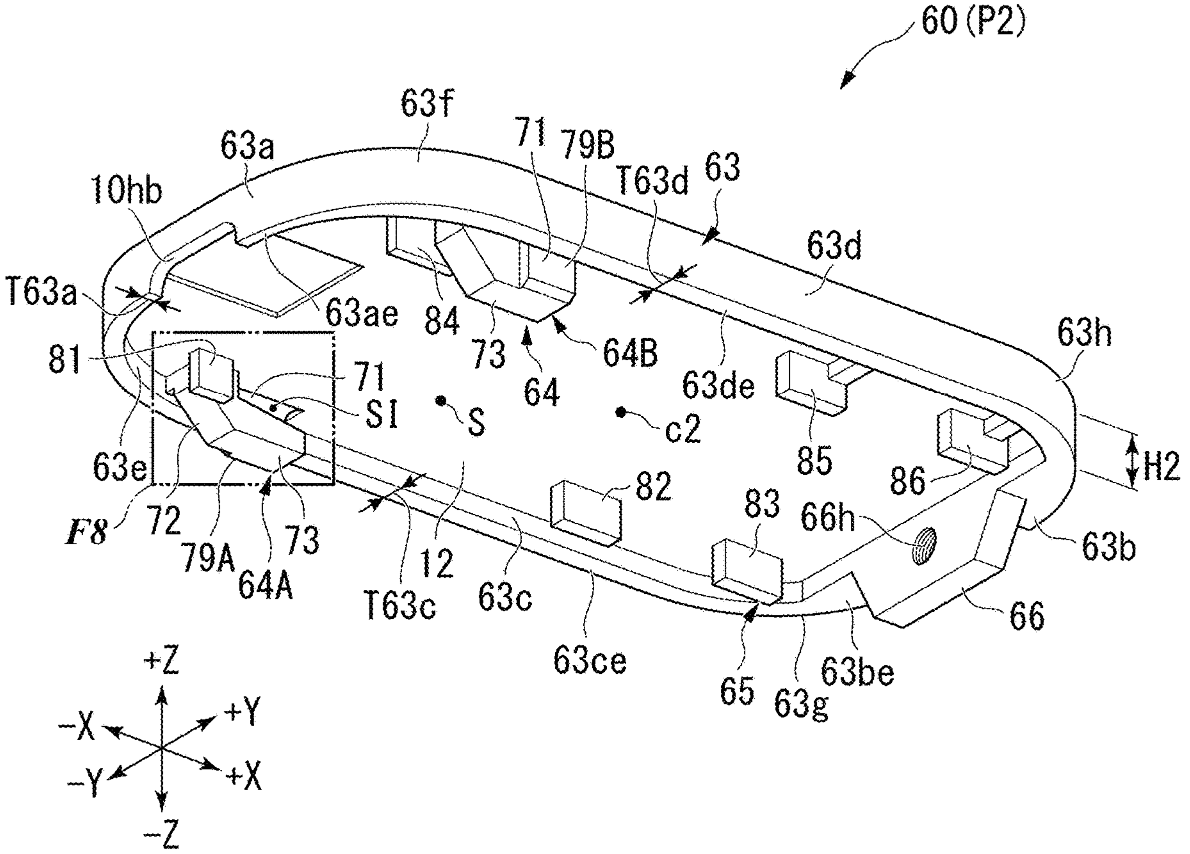
FIG. 6 is a perspective view showing a cover according to the first embodiment.

FIG. 6 is a perspective view showing the cover 60. The cover 60 has, for example, the second main wall 12, a circumferential wall 63, the receiving portion 64, a board support portion 65, and the fixing portion 66. Since the second main wall 12 has been described above, duplicate description will be omitted here.

In the present embodiment, the cover 60 is a single-piece metal part P2 integrally molded by die casting. For example, the second main wall 12, the circumferential wall 63, the receiving portion 64, the board support portion 65, and the fixing portion 66 are integrally molded as the single-piece metal part P2. The metal part P2 is an example of a "second part". The cover 60 is molded by, for example, aluminum die casting, but may be molded by die casting using another metal material.

<2.1 Circumferential Wall>

First, the circumferential wall 63 will be described. The circumferential wall 63 is a wall portion that forms a part of the circumferential wall 13 of the housing 10 described above. The circumferential wall 63 includes, for example, a third end wall 63*a*, a fourth end wall 63*b*, a third side wall 63*c*, a fourth side wall 63*d*, a fifth curved wall 63*e*, a sixth curved wall 63*f*, a seventh curved wall 63*g*, and an eighth curved wall 63*h*. In the present embodiment, heights H2 in the Z direction of the end walls 63*a* and 63*b*, the side walls 63*c* and 63*d*, and the curved walls 63*e*, 63*f*, 63*g*, and 63*h* are the same as each other. In the present embodiment, the height H2 of the circumferential wall 63 of the cover 60 is smaller than the height H1 of the circumferential wall 33 of the base 30 (see FIG. 3).

(Third End Wall)

The third end wall 63*a* is an upright wall extending in the −Z direction from an end part of the second main wall 12 on the side in the −X direction. The third end wall 63*a* is, for example, a flat wall extending in the Y direction and the Z direction. The third end wall 63*a* forms a part of the first end wall 13*a* of the housing 10 described above. In the present embodiment, a lower end surface 63*ae* of the third end wall 63*a* comes into contact with an upper end surface 33*ae* of the first end wall 33*a* of the base 30 (see FIG. 3). For example, the lower end surface 63*ae* of the third end wall 63*a* is placed on the upper end surface 33*ae* of the first end wall 33*a* of the base 30. Each of the lower end surface 63*ae* and the upper end surface 33*ae* is a flat surface extending in the X direction and the Y direction. The third end wall 63*a* has, for example, an upper half 10*hb* of the opening 10*h*. In the present embodiment, the first end wall 13*a* of the housing 10 is formed by the third end wall 63*a* of the cover 60 and the first end wall 33*a* of the base 30

(Fourth End Wall)

The fourth end wall 63*b* is an upright wall extending in the −Z direction from an end part of the second main wall 12 on the side in the +X direction. The fourth end wall 63*b* is, for example, a flat wall extending in the Y direction and the Z direction. The fourth end wall 63*b* forms a part of the second end wall 13*b* of the housing 10 described above. In the present embodiment, a lower end surface 63*be* of the fourth end wall 63*b* comes into contact with an upper end surface 33*be* of the second end wall 33*b* of the base 30 (see FIG. 3). For example, the lower end surface 63*be* of the fourth end wall 63*b* is placed on the upper end surface 33*be* of the second end wall 33*b* of the base 30. Each of the lower end surface 63*be* and the upper end surface 33*be* is a flat surface extending in the X direction and the Y direction. In the present embodiment, the fourth end wall 63*b* of the cover 60 and the second end wall 33*b* of the base 30 form the second end wall 13*b* of the housing 10.

(Third Side Wall)

The third side wall 63*c* is an upright wall extending in the −Z direction from an end part of the second main wall 12 on the side in the −Y direction. The third side wall 63*c* is, for example, a flat wall extending in the Y direction and the Z direction. The third side wall 63*c* forms a part of the first side wall 13*c* of the housing 10 described above. In the present embodiment, a lower end surface 63*ce* of the third side wall 63*c* comes into contact with the upper end surface 33*ce* of the first side wall 33*c* of the base 30 (see FIG. 3). For example, the lower end surface 63*ce* of the third side wall 63*c* is placed on the upper end surface 33*ce* of the first side wall 33*c* of the base 30 (see FIG. 3). Each of the lower end surface 63*ce* and the upper end surface 33*ce* is a flat surface extending in the X direction and the Y direction. In the present embodiment, the first side wall 13*c* of the housing 10 is formed by the third side wall 63*c* of the cover 60 and the first side wall 33*c* of the base 30. In the present embodiment, a thickness T63*c* of the third side wall 63*c* in the Y direction is larger than the thickness T63*a* of the third end wall 63*a* in the X direction. From another perspective, the thickness T63*c* of the third side wall 63*c* in the Y direction is larger than the thickness T21 of the board 21 in the Z direction (see FIG. 2).

(Fourth Side Wall)

The fourth side wall 63*d* is an upright wall extending in the +Z direction from the end part of the first main wall 11 on the side in the +Y direction. The fourth side wall 63*d* is, for example, a flat wall extending in the Y direction and the Z direction. The fourth side wall 63*d* forms a part of the second side wall 13*d* of the housing 10 described above. In the present embodiment, a lower end surface 63*de* of the fourth side wall 63*d* comes into contact with the upper end surface 33*de* of the second side wall 33*d* of the base 30 (see FIG. 3). For example, the lower end surface 63*de* of the fourth side wall 63*d* is placed on the upper end surface 33*de* of the second side wall 33*d* of the base 30. Each of the lower end surface 63*de* and the upper end surface 33*de* is a flat surface extending in the X direction and the Y direction. In the present embodiment, the second side wall 13*d* of the housing 10 is formed by the fourth side wall 63*d* of the cover 60 and the second side wall 33*d* of the base 30. In the present embodiment, the thickness T63*d* of the fourth side wall 63*d* in the Y direction is larger than the thickness T63*a* of the third end wall 63*a* in the X direction. From another perspective, the thickness T63*d* of the fourth side wall 63*d* in the Y direction is larger than the thickness T21 of the board 21 in the Z direction (see FIG. 2).

(Fifth Curved Wall, Sixth Curved Wall, Seventh Curved Wall, and Eighth Curved Wall)

Each of the fifth curved wall 63*e*, the sixth curved wall 63*f*, the seventh curved wall 63*g*, and the eighth curved wall 63*h* is an upright wall extending from an end part of the second main wall 12 in the −Z direction. Each of the fifth curved wall 63*e*, the sixth curved wall 63*f*, the seventh curved wall 63*g*, and the eighth curved wall 63*h* is an arc-shaped wall portion that protrudes toward the outside of the housing 10.

The fifth curved wall 63*e* is positioned between the third end wall 63*a* and the third side wall 63*c*. The fifth curved wall 63*e* connects the third end wall 63*a* and the third side wall 63*c*. The fifth curved wall 63*e* forms a part of the first curved wall 13*e* of the housing 10 described above. In the present embodiment, the first curved wall 13*e* of the housing 10 is formed by the fifth curved wall 63*e* of the cover 60 and the first curved wall 33*e* of the base 30.

The sixth curved wall 63*f* is positioned between the third end wall 63*a* and the fourth side wall 63*d*. The sixth curved wall 63*f* connects the third end wall 63*a* and the fourth side wall 63*d*. The sixth curved wall 63*f* forms a part of the second curved wall 13*f* of the housing 10 described above. In the present embodiment, the second curved wall 13*f* of the housing 10 is formed by the sixth curved wall 63*f* of the cover 60 and the second curved wall 33*f* of the base 30.

The seventh curved wall 63*g* is positioned between the fourth end wall 63*b* and the third side wall 63*c*. The seventh curved wall 63*g* connects the fourth end wall 63*b* and the third side wall 63*c*. The seventh curved wall 63*g* forms a part of the third curved wall 13*g* of the housing 10 described above. In the present embodiment, the third curved wall 13*g* of the housing 10 is formed by the seventh curved wall 63*g* of the cover 60 and the third curved wall 33*g* of the base 30.

The eighth curved wall 63*h* is positioned between the fourth end wall 63*b* and the fourth side wall 63*d*. The eighth curved wall 63*h* connects the fourth end wall 63*b* and the fourth side wall 63*d*. The eighth curved wall 63*h* forms a part of the fourth curved wall 13*h* of the housing 10 described above. In the present embodiment, the fourth curved wall 13*h* of the housing 10 is formed by the eighth curved wall 63*h* of the cover 60 and the fourth curved wall 33*h* of the base 30.

<3.2 Receiving Portion>

Next, the receiving portion 64 will be described. The receiving portion 64 is a portion that engages with the engagement portion 34 of the base 30. The receiving portion 64 is provided on the second main wall 12. The receiving portion 64 protrudes from the second main wall 12 to the inside of the housing 10. The receiving portion 64 is disposed in the housing space S of the housing 10.

(Disposition Position of Receiving Portion)

In the present embodiment, the receiving portion 64 includes a plurality of receiving portions 64A and 64B (a first receiving portion 64A and a second receiving portion 64B). The plurality of receiving portions 64A and 64B are positioned, for example, displaced to the side in the −X direction with respect to a center C2 of the second main wall 12 in the X direction.

Figure 7:
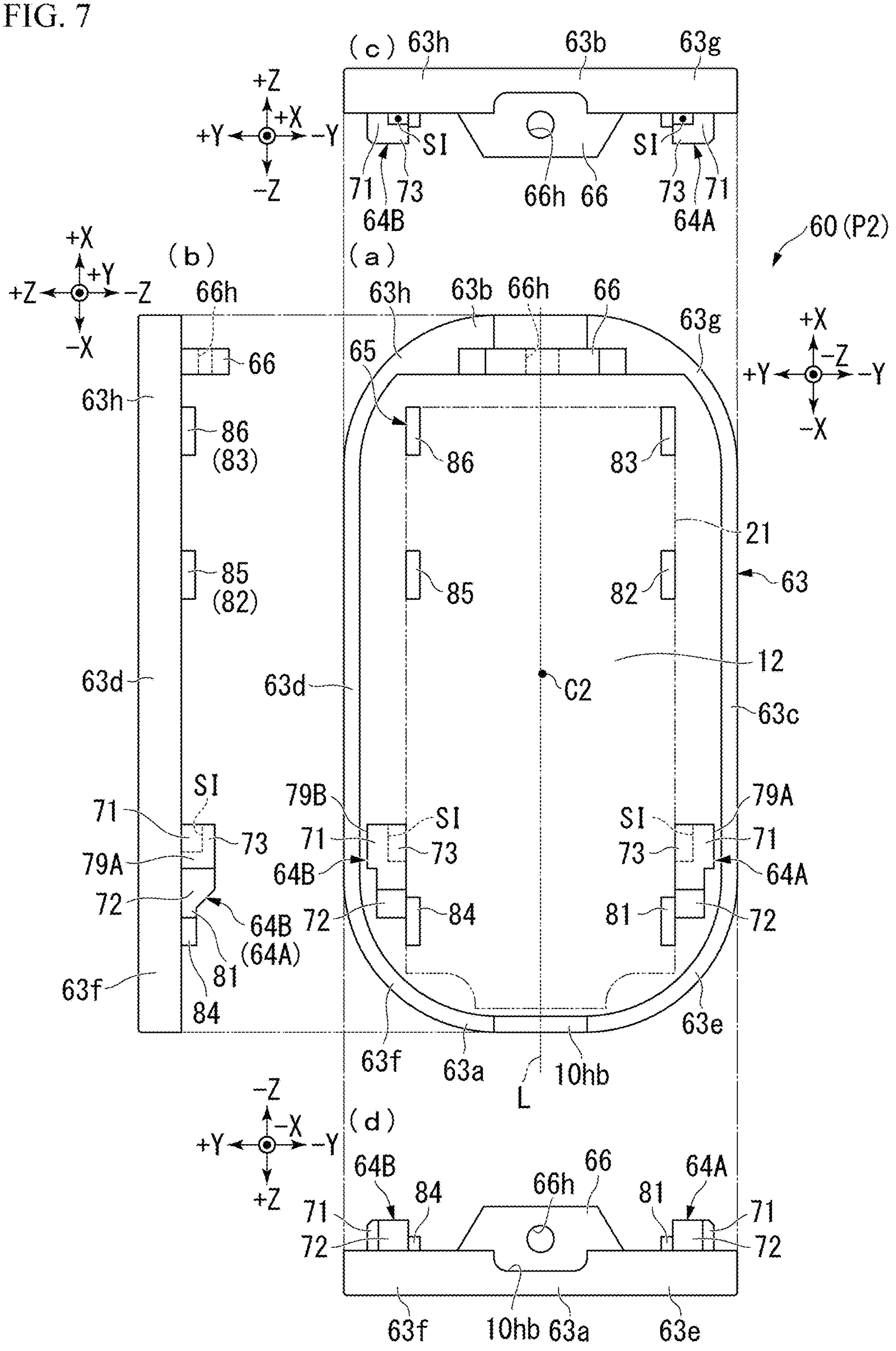
FIG. 7 is a view showing the cover according to the first embodiment.

FIG. 7 is a view showing the cover 60. PART (a) of FIG. 7 shows the cover 60 when viewed from the side in the −Z direction. PART (b) of FIG. 7 shows the cover 60 when viewed from the side in the +Y direction. PART (c) of FIG. 7 shows the cover 60 when viewed from the side in the +X direction. PART (d) of FIG. 7 shows the cover 60 when viewed from the side in the −X direction. In the present embodiment, the first receiving portion 64A is disposed between the board 21 and the third side wall 63*c* when viewed from the Z direction. The first receiving portion 64A is adjacent to, for example, the third side wall 63*c* in the Y direction. The first receiving portion 64A is connected to an inner surface of the third side wall 63*c*. The second receiving portion 64B is disposed between the board 21 and the fourth side wall 63*d* when viewed from the Z direction. The second receiving portion 64B is adjacent to, for example, the fourth side wall 63*d* in the Y direction. The second receiving portion 64B is connected to an inner surface of the fourth side wall 63*d*.

(Shape of Engagement Portion)

In the present embodiment, the plurality of receiving portions 64A and 64B have a shape that is bilaterally symmetrical with a virtual line L extending in the X direction through the center C2 of the second main wall 12 as a central line. Therefore, in the following, a shape of the first receiving portion 64A will be described as a representative example. In description related to a shape of the second receiving portion 64B, description of the first receiving portion 64A need only be read as follows. Specifically, in the description of the first receiving portion 64A, the "−Y direction" need only be read as the "+Y direction". The "+Y direction" need only be read as the "−Y direction". The "first engagement portion 34A" need only be read as the "second engagement portion 34B". The "third side wall 63*c*" need only be read as the "fourth side wall 63*d*". The "lower end surface 63*ce* of the third side wall 63*c*" need only be read as the "lower end surface 63*de* of the fourth side wall 63*d*". The "first gap g1" need only be read as the "third gap g3". The "first guide surface 39A" need only be read as the "second guide surface 39B". A "first guide portion 79A" need only be read as a "second guide portion 79B".

Figure 8:
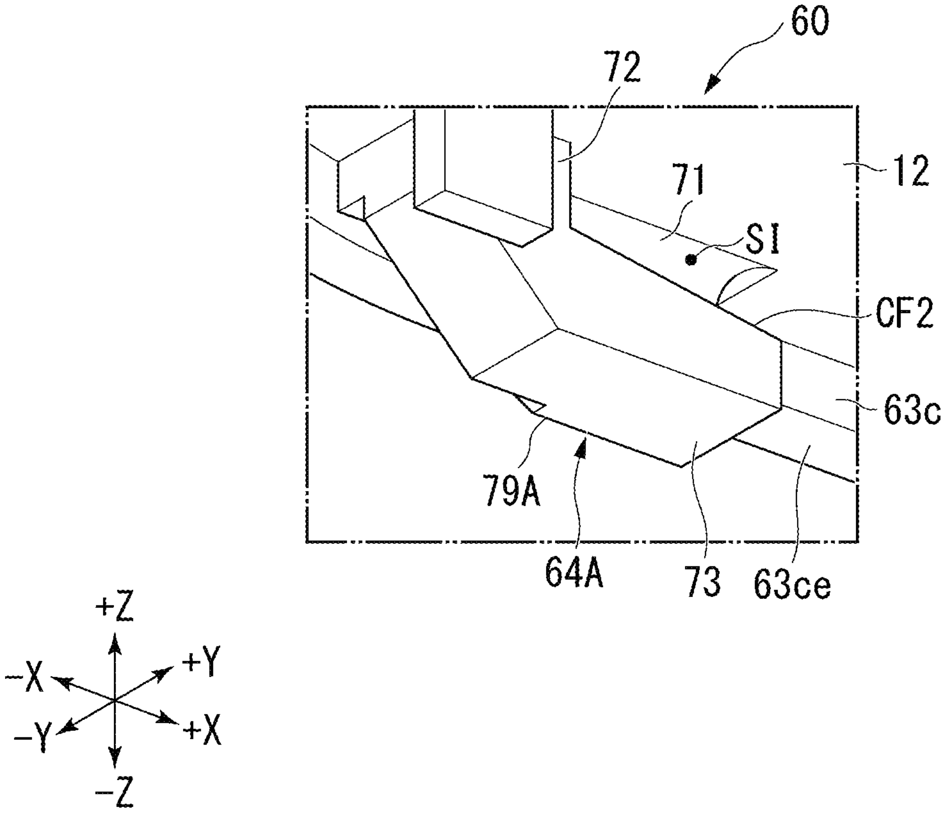
FIG. 8 is an enlarged perspective view showing a region surrounded by the dashed dotted line F8 shown in FIG. 6.

FIG. 8 is an enlarged perspective view showing a region surrounded by the dashed dotted line F8 shown in FIG. 6. The first receiving portion 64A has, for example, a first base portion 71, a second base portion 72, an extension portion 73, and an insertion space SI. The insertion space SI is a space defined by the first base portion 71, the second base portion 72, the extension portion 73, and the second main wall 12. The first base portion 71 is an example of a "third portion". The extension portion 73 is an example of a "fourth portion".

(First Base Portion)

Figure 9:
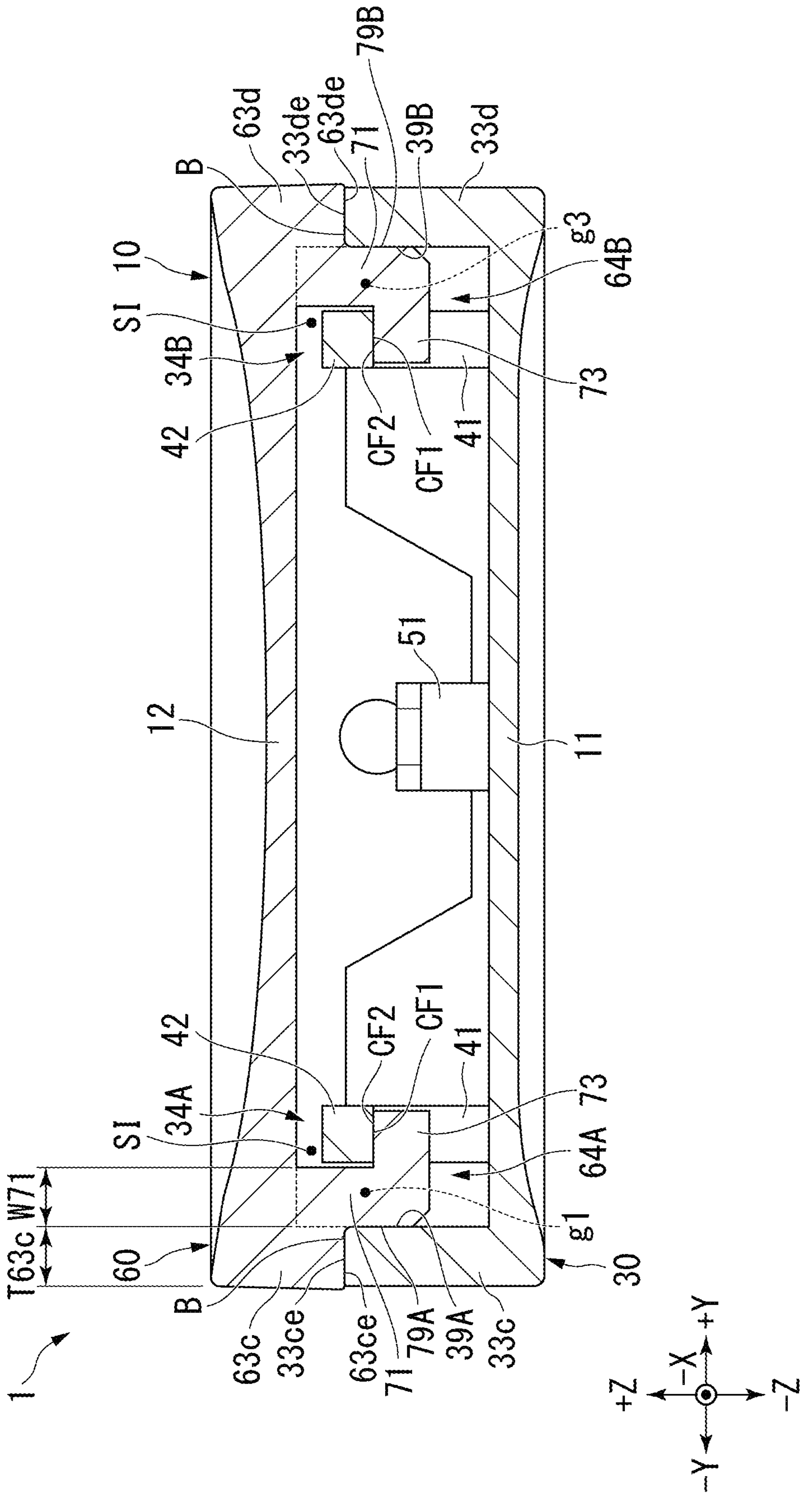
FIG. 9 is a cross-sectional view along line F9-F9 of the semiconductor storage device shown in FIG. 1.

FIG. 9 is a cross-sectional view along line F9-F9 of the semiconductor storage device 1 shown in FIG. 1. Note that, for convenience of explanation, illustration of the board unit 20 is omitted in FIG. 9. The first base portion 71 extends from the second main wall 12 in the −Z direction. At least a part of the first base portion 71 is adjacent to the third side wall 63*c* in the Y direction and is connected to the third side wall 63*c* in the Y direction. In the present embodiment, the first base portion 71 extends to the side in the −Z direction beyond the lower end surface 63*ce* of the third side wall 63*c* (the boundary portion B between the base 30 and the cover 60). The first base portion 71 is a plate portion extending in the X direction and the Y direction. A width W71 (for example, a maximum width) of the first base portion 71 in the Y direction is, for example, equal to or larger than the thickness T63*c* of the third side wall 63*c* in the Y direction. The first base portion 71 supports the extension portion 73 from the side in the −Y direction.

In the present embodiment, at least a part of the first base portion 71 is inserted into the first gap g1 between the first engagement portion 34A and the first side wall 33*c*. The first base portion 71 has the guide portion 79A extending along an inner surface of the first side wall 33*c*. The guide portion 79A extends along, for example, the guide surface 39A of the first side wall 33*c*. In a process in which the base 30 and the cover 60 are combined, the guide portion 79A is guided by the guide surface 39A of the first side wall 33*c* to be slid in the +X direction.

(Second Base Portion)

Figure 10:
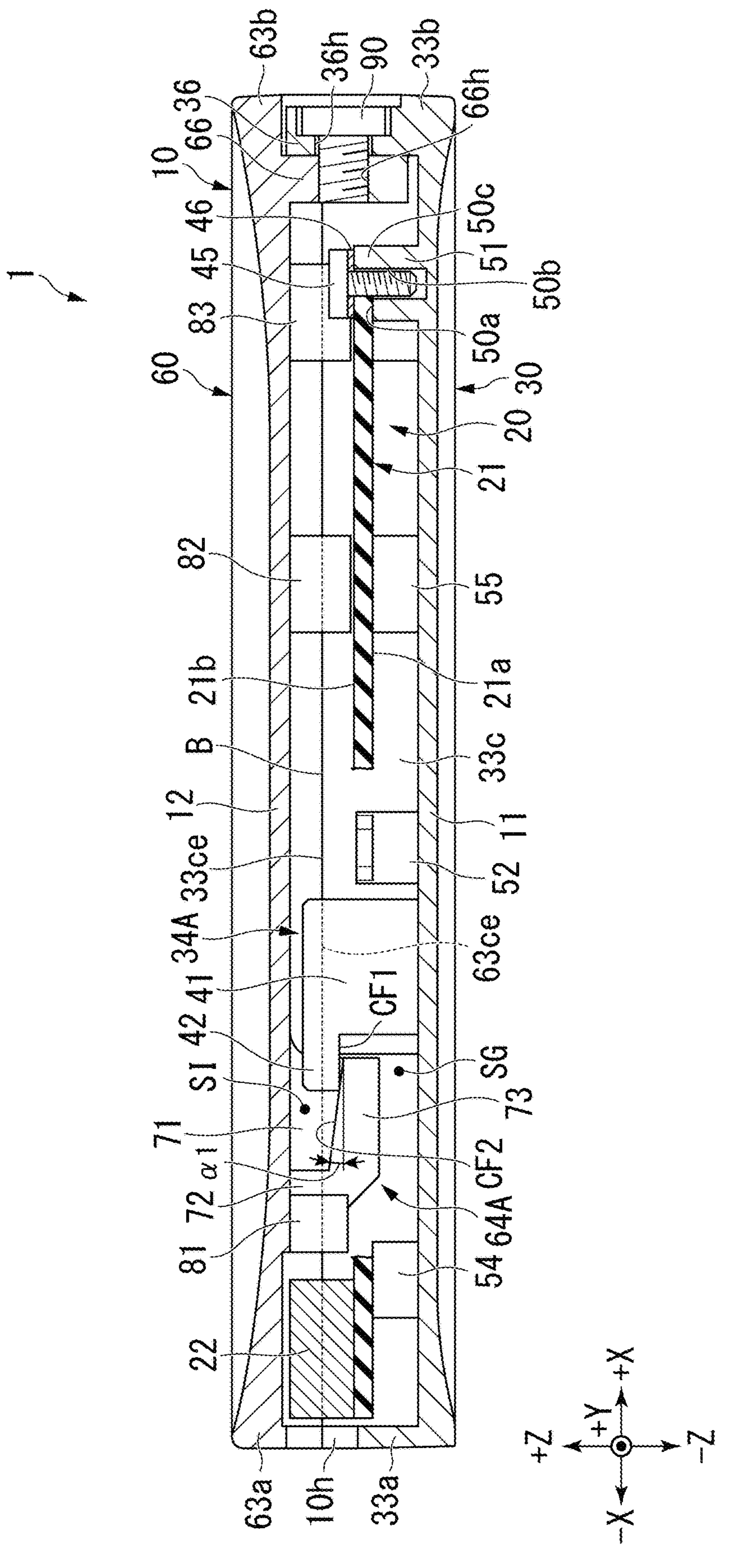
FIG. 10 is a cross-sectional view along line F10-F10 of the semiconductor storage device shown in FIG. 1.

FIG. 10 is a cross-sectional view along line F10-F10 of the semiconductor storage device 1 shown in FIG. 1. Note that, for convenience of explanation, illustrations of the controller 23 and the NAND 24 on the board 21 are omitted in FIG. 10. The second base portion 72 extends in the −Z direction from the second main wall 12. In the present embodiment, the second base portion 72 extends to the side in the −Z direction beyond the lower end surface 63*ce* of the third side wall 63*c* (the boundary portion B between the base 30 and the cover 60). The second base portion 72 supports the extension portion 73 from the side in the −X direction.

(Extension Portion)

The extension portion 73 extends in the +Y direction from an end part of the first base portion 71 on the side in the −Z direction (see FIG. 9). From another perspective, the extension portion 73 extends in the +X direction from an end part of the second base portion 72 on the side in the −Z direction. At least a part of the extension portion 73 is positioned, for example, on the side in the −Z direction with respect to the lower end surface 63*ce* of the third side wall 63*c* (the boundary portion B between the base 30 and the cover 60). The extension portion 73 is positioned apart from the second main wall 12. Between the extension portion 73 and the second main wall 12, the insertion space SI is defined by an upper surface of the extension portion 73 and a lower surface of the second main wall 12.

The insertion space SI on the side in the −Y direction is closed by the first base portion 71 (see FIG. 9). On the other hand, the insertion space SI on the side in the +Y direction is open to the inside of the housing 10 (see FIG. 9). The insertion space SI on the side in the −X direction is closed by the second base portion 72. On the other hand, the insertion space SI on the side in the +X direction is open to the inside of the housing 10.

The protruding portion 42 of the first engagement portion 34A is inserted into the insertion space SI from the side in the +X direction. The extension portion 73 is a portion facing the protruding portion 42 of the first engagement portion 34A, which is inserted into the insertion space SI, from the side in the −Z direction. The extension portion 73 is a portion facing the protruding portion 42 of the first engagement portion 34A, which is inserted into the insertion space SI, from the side opposite to the second main wall 12.

The extension portion 73 has a second contact portion CF2 exposed to the insertion space SI. The second contact portion CF2 comes into contact with the first contact portion CF1 of the protruding portion 42 when the protruding portion 42 of the first engagement portion 34A is inserted into the insertion space SI. In the present embodiment, the first contact portion CF1 of the first engagement portion 34A and the second contact portion CF2 of the first receiving portion 64A come into contact with each other. Therefore, the first engagement portion 34A and the first receiving portion 64A engage with each other.

In the present embodiment, the second contact portion CF2 is inclined with respect to the X direction so that the second contact portion CF2 is positioned further on the side in the +Z direction as it advances in the −X direction. For example, the second contact portion CF2 is inclined with respect to the X direction so that the insertion space SI becomes narrower in the −X direction. From another perspective, the second contact portion CF2 is inclined with respect to the X direction so that a contact force generated between the protruding portion 42 and the extension portion 73 increases as an amount of movement of the cover 60 in the +X direction with respect to the base 30 (an amount of movement in a direction in which the protruding portion 42 is inserted into the insertion space SI) increases.

Also, from another perspective, the second contact portion CF2 is inclined at a first angle $\alpha 1$ with respect to the X direction so that the second contact portion CF2 is positioned further on the side in the +Z direction as it advances in the −X direction. On the other hand, the first contact portion CF1 is parallel to the X direction. Note that, alternatively, the first contact portion CF1 may be inclined at a second angle with respect to the X direction. The second angle is different from the first angle $\alpha 1$. The second angle is, for example, an angle inclined with respect to the X direction so that the angle is positioned further on the side in the +Z direction as it advances in the −X direction, and is an angle smaller than the first angle $\alpha 1$. Also, instead of the above-described example, the first angle $\alpha 1$ and the second angle may be the same angle.

<3.3 Board Support Portion>

Next, returning to FIG. 6, the board support portion 65 will be described. The board support portion 65 is a support portion that supports the board 21 inside the housing 10. The board support portion 65 has, for example, a first support portion 81, a second support portion 82, a third support portion 83, a fourth support portion 84, a fifth support portion 85, and a sixth support portion 86.

Each of the first support portion 81, the second support portion 82, the third support portion 83, the fourth support portion 84, the fifth support portion 85, and the sixth support portion 86 is a protruding portion that protrudes in the −Z direction from the second main wall 12. Each of the first support portion 81, the second support portion 82, and the third support portion 83 is disposed at a position overlapping the end part of the board 21 on the side in the −Y direction when viewed from the Z direction. The first support portion 81, the second support portion 82, and the third support portion 83 are separately disposed in the X direction (see FIG. 7). The first support portion 81, the second support portion 82, and the third support portion 83 face the second surface 21*b* of the board 21 from the side in the +Z direction. The first support portion 81, the second support portion 82, and the third support portion 83 support the board 21. The fourth support portion 84, the fifth support portion 85, and the sixth support portion 86 are disposed at positions overlapping the end part of the board 21 on the side in the +Y direction when viewed from the Z direction. The fourth support portion 84, the fifth support portion 85, and the sixth support portion 86 are separately disposed in the X direction (see FIG. 7). The fourth support portion 84, the fifth support portion 85, and the sixth support portion 86 face the second surface 21*b* of the board 21 from the side in the +Z direction. The fourth support portion 84, the fifth support portion 85, and the sixth support portion 86 support the board 21.

In the present embodiment, the first support portion 81, the second support portion 82, the third support portion 83, the fourth support portion 84, the fifth support portion 85, and the sixth support portion 86 face (for example, come into contact with) the board 21 from the side opposite to the fourth support portion 54, the fifth support portion 55, the sixth support portion 56, the seventh support portion 57, the eighth support portion 58, and the ninth support portion 59 of the base 30. Therefore, the board 21 is clamped between the base 30 and the cover 60. Note that, in the present application, "supporting the board" may also include a case in which, although a product is not in contact with the board at the time of shipment, the product comes into contact with the board and supports the board when some parts are deformed (for example, when the board is warped) due to heat generation, aging deterioration, or the like of the product, or the like.

<3.4 Fixing Portion>

The fixing portion 66 is a portion that is fixed to the fixing portion 36 of the base 30 by the fastening member 90. The fixing portion 66 is an example of a "second fixing portion". In the present embodiment, the fixing portion 66 is provided at the second end part 10*b* of the housing 10. The fixing portion 66 is, for example, a protruding portion that protrudes in the −Z direction from the second main wall 12. The fixing portion 66 is, for example, a plate portion extending in the Y direction and the Z direction. The fixing portion 66 is disposed at a position adjacent to the fixing portion 36 of the base 30 in the X direction. In the present embodiment, the fixing portion 66 is disposed on the side in the −X direction of the fixing portion 36 of the base 30. The fixing portion 66 is positioned between the fixing portion 36 of the base 30 and the board 21. The fixing portion 66 has an engagement hole 66*h* with which the fastening member 90 engages. An inner circumferential surface of the engagement hole 66*h* has a female thread.

4. Fastening Member

The fastening member 90 is a member that fastens the base 30 and the cover 60 together. In the present embodiment, the fastening member 90 fastens the fixing portion 36 of the base 30 and the fixing portion 66 of the cover 60 in a state in which the first engagement portion 34A and the second engagement portion 34B are engaged with the first receiving portion 64A and the second receiving portion 64B, respectively.

The fastening member 90 is, for example, a screw member. The fastening member 90 is disposed in the X direction. The fastening member 90 is inserted into the insertion hole 36*h* of the fixing portion 36 of the base 30 in a state in which the first engagement portion 34A and the second engagement portion 34B are engaged with the first receiving portion 64A and the second receiving portion 64B, respectively. The fastening member 90 engages into the engagement hole 66*h* of the fixing portion 66 of the cover 60. Note that, in the present application, "the fastening member fastens the fixing portion of the base and the fixing portion of the cover in a state in which the engagement portion is engaged with the receiving portion" is not limited to a case in which the fixing portion of the base and the fixing portion of the cover are fixed after the engagement portion is engaged with the receiving portion. "The fastening member fastens the fixing portion of the base and the fixing portion of the cover in a state in which the engagement portion is engaged with the receiving portion" may also include a case in which the fastening member is attached to the fixing portion of the base or the fixing portion of the cover before the engagement portion is engaged with the receiving portion, and fastening with the fastening member is performed to cause the cover to move with respect to the base, resulting in engagement of the engagement portion and the receiving portion.

In the present embodiment, a force acting direction of the cover 60 coincides with a movement direction (+X direction) of the cover 60. Here, in the force acting direction of the cover 60, a force intended to move the cover 60 acts when the fastening member 90 rotates in a fastening direction. In the movement direction of the cover 60, the cover 60 moves with respect to the base 30 so that the contact force generated between the protruding portion 42 and the extension portion 73 increases. Therefore, when the fastening member 90 rotates in the fastening direction, the protruding portion 42 and the extension portion 73 come into contact with each other more reliably.

Figure 11:
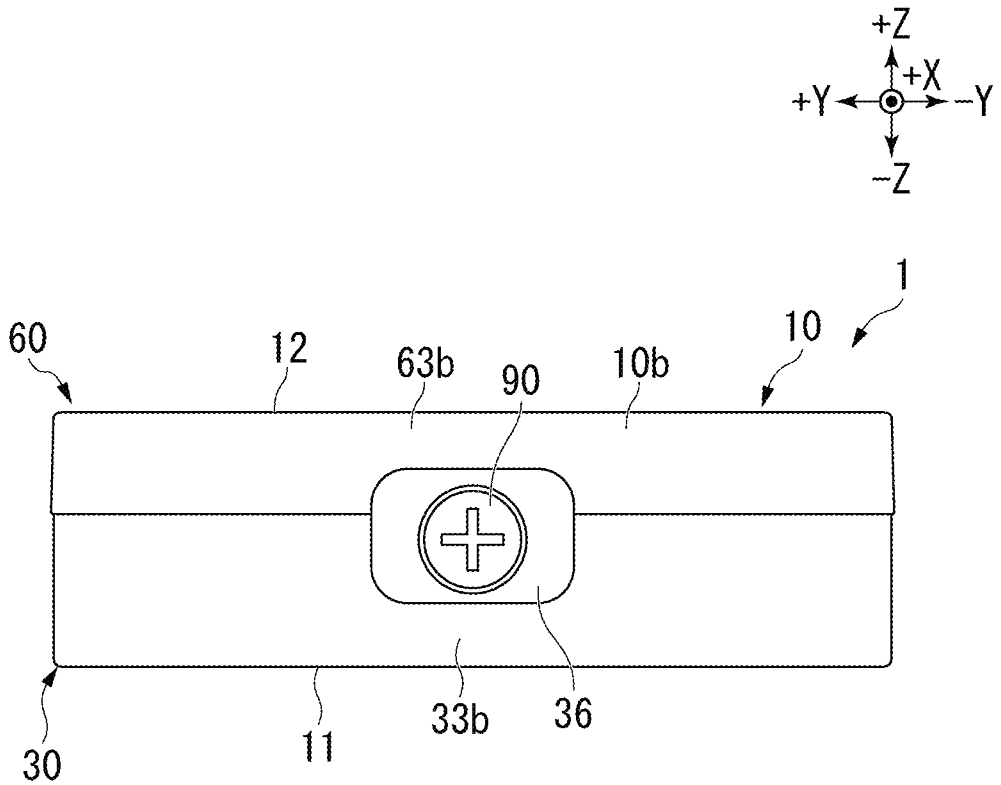
FIG. 11 is a front view showing the semiconductor storage device according to the first embodiment.

FIG. 11 is a front view showing the semiconductor storage device 1. In the present embodiment, the fastening member 90 is provided at a central portion of the second end part 10*b* of the housing 10 in the Z direction. In the present embodiment, the screw member, except for one fastening member 90, is not exposed to the outside of the housing 10.

5. Manufacturing Method of Semiconductor Storage Device

Next, a manufacturing method of the semiconductor storage device 1 will be described.

Figure 12A:
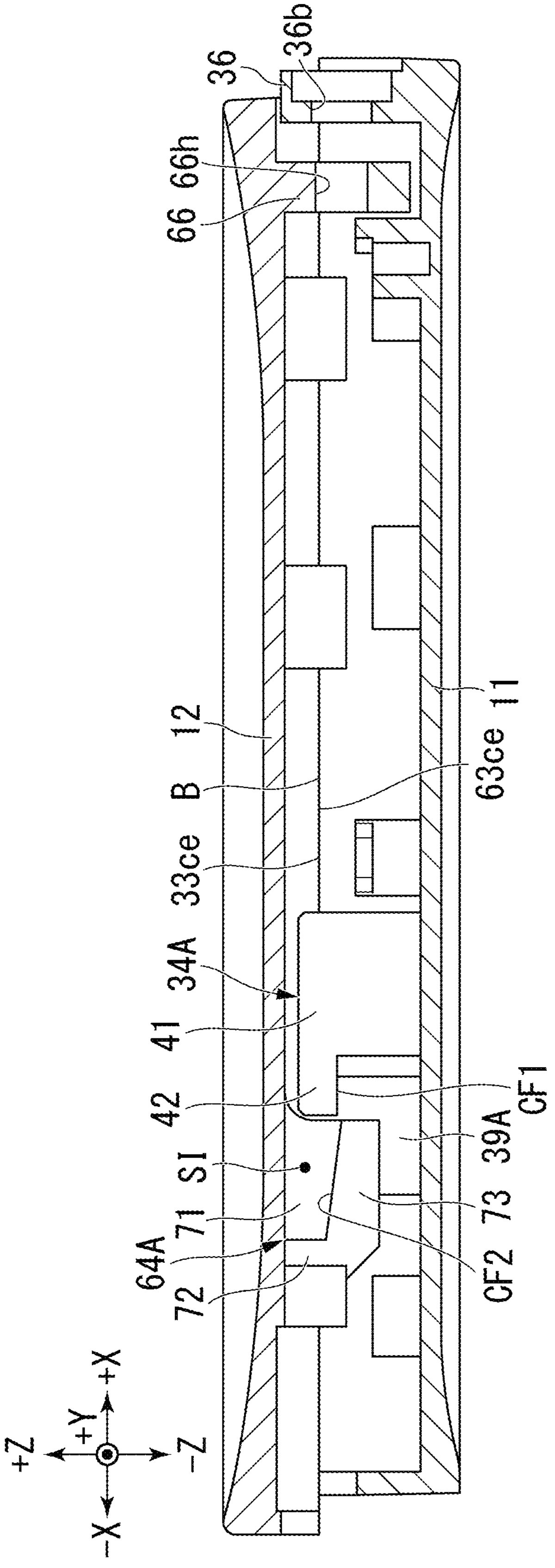
FIG. 12A is a cross-sectional view for explaining a manufacturing method of the semiconductor storage device according to the first embodiment.
Figure 12B:
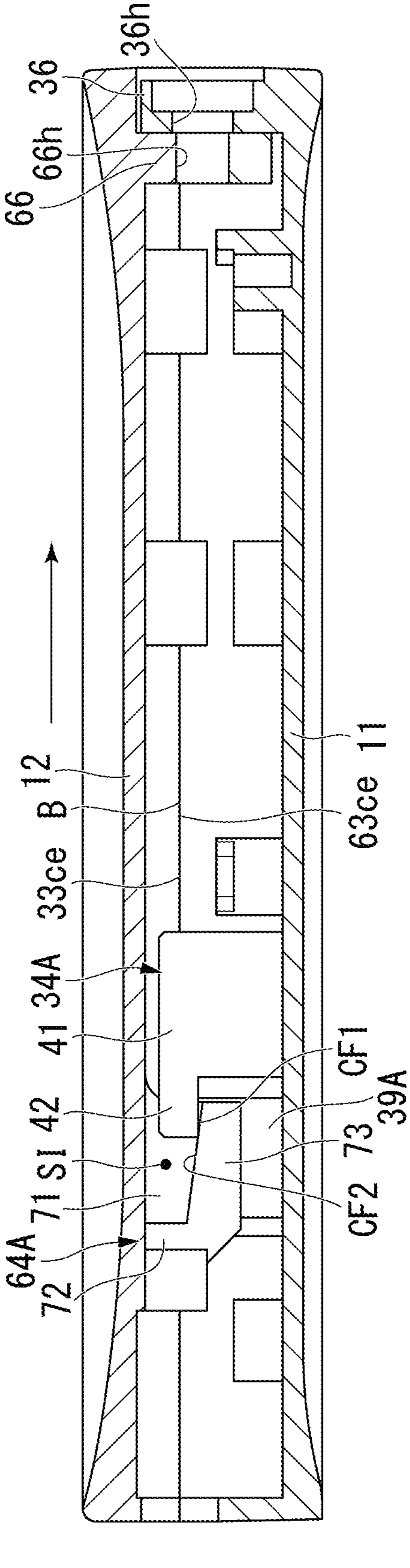
FIG. 12B is a cross-sectional view for explaining a manufacturing method of the semiconductor storage device according to the first embodiment.

FIGS. 12A and 12B are cross-sectional views for explaining a manufacturing method of the semiconductor storage device 1. Note that, for convenience of explanation, illustration of the board unit 20 is omitted in FIGS. 12A and 12B.

In the present embodiment, first, the board unit 20 is accommodated inside the base 30. Then, the board unit 20 is fixed to the board support portion 35 of the base 30 by a plurality of screw members 45 and washers 46.

Next, after the board unit 20 is fixed inside the base 30, the cover 60 is placed on the base 30 in a state in which the cover 60 is displaced to the side in the −X direction with respect to the base 30 as shown in FIG. 12A. For example, the lower end surface 63*ce* of the third side wall 63*c* of the cover 60 is placed on the upper end surface 33*ce* of the first side wall 33*c* of the base 30. The lower end surface 63*de* of the fourth side wall 63*d* of the cover 60 is placed on the upper end surface 33*de* of the second side wall 33*d* of the base 30.

At this time, the guide portion 79A of the first receiving portion 64A of the cover 60 extends along the guide surface 39A of the first side wall 33*c* of the base 30. The guide portion 79B of the second receiving portion 64B of the cover 60 extends along the guide surface 39B of the second side wall 33*d* of the base 30. Therefore, positioning of the base 30 and the cover 60 in the Y direction takes place.

Next, as shown in FIG. 12B, the cover 60 is slid in the +X direction with respect to the base 30. Therefore, the protruding portion 42 of the first engagement portion 34A is inserted into the insertion space SI of the first receiving portion 64A. The protruding portion 42 of the second engagement portion 34B is inserted into the insertion space SI of the second receiving portion 64B. Note that, in the present application, "moving the second member in the second direction with respect to the first member" means moving the second member in the second direction relative to the first member. That is, "moving the second member in the second direction with respect to the first member" is not limited to moving the second member in the second direction (+X direction) while a position of the first member is fixed, but may also include moving the first member in the first direction (−X direction) while a position of the second member is fixed.

Next, the cover 60 is further slid with respect to the base 30 in the +X direction. Therefore, the first contact portion CF1 of the protruding portion 42 of the first engagement portion 34A comes into contact with the second contact portion CF2 of the extension portion 73 of the first receiving portion 64A, and the first engagement portion 34A and the first receiving portion 64A are engaged with each other. Similarly, the first contact portion CF1 of the protruding portion 42 of the second engagement portion 34B comes into contact with the second contact portion CF2 of the extension portion 73 of the second receiving portion 64B, and the second engagement portion 34B and the second receiving portion 64B are engaged with each other. Therefore, positioning of the base 30 and the cover 60 in the Z direction takes place.

Next, the fastening member 90 is inserted through the insertion hole 36*h* of the fixing portion 36 of the base 30, and then is engaged with the engagement hole 66*h* of the fixing portion 66 of the cover 60. Therefore, the cover 60 is not detached from the base 30 in the −X direction. Therefore, the semiconductor storage device 1 is completed.

6. Advantages

In the present embodiment, the base 30 has the first engagement portion 34A and the fixing portion 36. The first engagement portion 34A is disposed inside the housing 10. The first engagement portion 34A has the base portion 41 extending in the Z direction and the protruding portion 42 extending in the −X direction from the base portion 41. The cover 60 has the first receiving portion 64A and the fixing portion 66. The first receiving portion 64A includes the insertion space SI that is open in the +X direction. When the cover 60 moves in the +X direction with respect to the base 30, the protruding portion 42 of the first engagement portion 34A is inserted into the insertion space SI and engages with the first engagement portion 34A. The fixing portion 66 is fixed to the fixing portion 36 by the fastening member 90 in a state in which the first engagement portion 34A and the first receiving portion 64A are engaged with each other.

According to such a configuration, the fastening member 90 is attached in a state in which the base 30 and the cover 60 are engaged with each other by the first engagement portion 34A and the first receiving portion 64A. Therefore, the number of fastening members 90 required to fasten the base 30 and the cover 60 can be reduced. Therefore, the number of parts in the semiconductor storage device 1 can be reduced. Also, if the number of required fastening members 90 can be reduced, the fastening member 90 exposed to the outside of the housing 10 becomes less visually noticeable, which makes it easier to improve a design of an external appearance of the semiconductor storage device 1.

In the present embodiment, the base portion 41 of the first engagement portion 34A extends in the Z direction from the first main wall 11. The protruding portion 42 of the first engagement portion 34A extends in the −X direction from the base portion 41 at a position apart from the first side wall 33*c* and the second side wall 33*d*. With such a configuration, an engagement structure between the base 30 and the cover 60 is formed at a position different from the first side wall 33*c* and the second side wall 33*d*. Therefore, it is easier to increase a fixing strength between the base 30 and the cover 60 compared to a case in which the first engagement portion 34A is provided on the first side wall 33*c* or the second side wall 33*d*.

In the present embodiment, the first receiving portion 64A includes the first base portion 71 and the extension portion 73. The first base portion 71 extends in the Z direction. The extension portion 73 extends in the +Y direction from the first base portion 71. The extension portion 73 faces the protruding portion 42 of the first engagement portion 34A from the side opposite to the second main wall 12. According to such a configuration, for example, it is easier to improve manufacturability (a structure of the mold, workability after casting, or the like) of the first receiving portion 64A compared to a case in which the extension portion 73 extends in the X direction from the first base portion 71.

In the present embodiment, the extension portion 73 of the first receiving portion 64A is provided across the insertion space SI from the second main wall 12. In other words, the extension portion 73 faces the second main wall 12 in the Z direction. The insertion space SI is sandwiched between the extension portion 73 and the second main wall 12. According to such a configuration, it is easier to secure a larger space of the insertion space SI compared to a case in which a structure defining an upper surface of the insertion space SI is separately provided. When a large space of the insertion space SI is secured, the protruding portion 42 of the first engagement portion 34A can be made thicker, and thereby it is easier to increase a rigidity of the semiconductor storage device 1.

In the present embodiment, the first gap g1 is provided between the first side wall 33*c* and the protruding portion 42 of the first engagement portion 34A. At least a part of the first base portion 71 of the first receiving portion 64A is disposed in the first gap g1. According to such a configuration, it becomes easier to perform positioning of the base 30 and the cover 60 in the Y direction using the first base portion 71 of the first receiving portion 64A.

In the present embodiment, the first base portion 71 of the first receiving portion 64A has the first guide portion 79A that extends along the inner surface of the first side wall 33*c*. When the cover 60 moves in the +X direction with respect to the base 30, the first guide portion 79A is guided by the inner surface of the first side wall 33*c* and moves in the +X direction. According to such a configuration, the first engagement portion 34A and the first receiving portion 64A can be engaged with each other in a state in which they are stably guided by the first guide portion 79A. Therefore, manufacturability of the semiconductor storage device 1 can be improved.

In the present embodiment, the extension portion 73 of the first receiving portion 64A has the second contact portion CF2 that comes into contact with the protruding portion 42 of the first engagement portion 34A. The second contact portion CF2 is inclined with respect to the X direction so that the insertion space SI becomes narrower in the −X direction. According to such a configuration, when the protruding portion 42 is inserted into the insertion space SI, an upper end of the protruding portion 42 comes into contact with the upper surface of the insertion space SI, a lower end of the protruding portion 42 comes into contact with a lower surface of the insertion space SI, and thereby a position of the cover 60 in the Z direction with respect to the base 30 becomes easier to be stably determined. Therefore, manufacturability of the semiconductor storage device 1 can be improved.

In the present embodiment, a direction of the force acting on the cover 60 when the fastening member 90 rotates in the fastening direction coincides with a direction (+X direction) in which the cover 60 moves with respect to the base 30 so that the contact force generated between the protruding portion 42 of the first engagement portion 34A and the extension portion 73 of the first receiving portion 64A increases. According to such a configuration, when the fastening member 90 rotates in the fastening direction, it is easier to determine the position of the cover 60 in the Z direction with respect to the base 30 more stably.

7. Modified Example

Next, some modified examples will be described. Configurations of each of the modified examples other than those described below are the same as the configurations of the first embodiment. Note that, these modified examples may be realized in combination with a second embodiment.

7.1 First Modified Example

Figure 13:
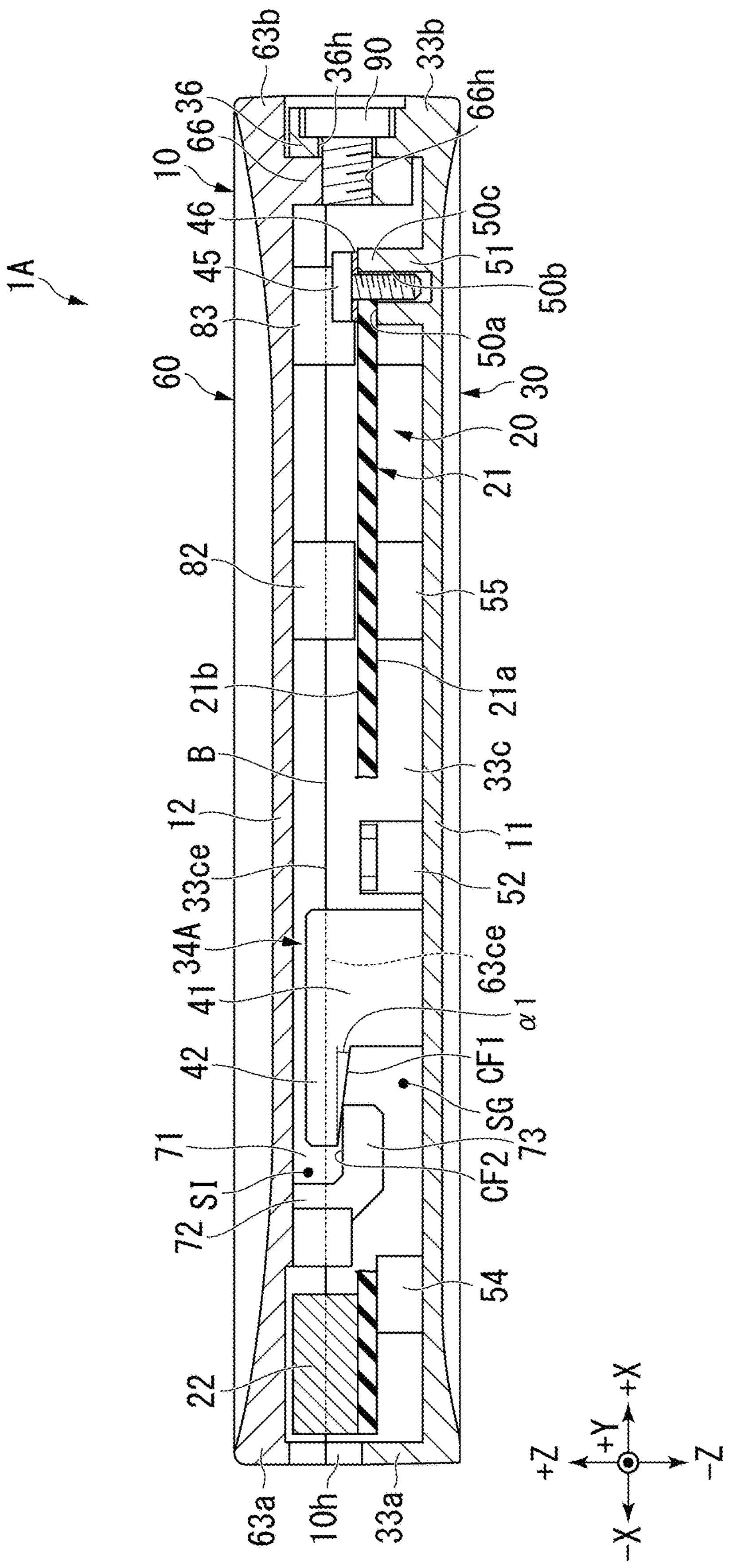
FIG. 13 is a cross-sectional view showing a semiconductor storage device according to a first modified example of the first embodiment.

FIG. 13 is a cross-sectional view showing a semiconductor storage device 1A of a first modified example. In the first modified example, the first contact portion CF1 is inclined at the first angle α1 with respect to the X direction so that first contact portion CF1 is positioned further on the side in the +Z direction as it advances in the −X direction. From another perspective, the first contact portion CF1 is inclined at the first angle α1 with respect to the X direction so that a thickness of the protruding portion 42 in the Z direction increases as it advances in the +X direction. On the other hand, the second contact portion CF2 is parallel to the X direction. Note that, alternatively, the second contact portion CF2 may be inclined at a second angle, which is different from the first angle α1, with respect to the X direction. The second angle is, for example, an angle inclined with respect to the X direction so that the angle is positioned further on the side in the +Z direction as it advances in the −X direction. The second angle is an angle smaller than the first angle α1.

According to such a configuration, as in the first embodiment, when the protruding portion 42 is inserted into the insertion space SI, an upper end of the protruding portion 42 comes into contact with an upper surface of the insertion space SI, a lower end of the protruding portion 42 comes into contact with a lower surface of the insertion space SI, and thereby a position of the cover 60 in the Z direction with respect to the base 30 becomes easier to be stably determined. Therefore, assembly of the semiconductor storage device 1 can be improved.

7.2 Second Modified Example

Figure 14:
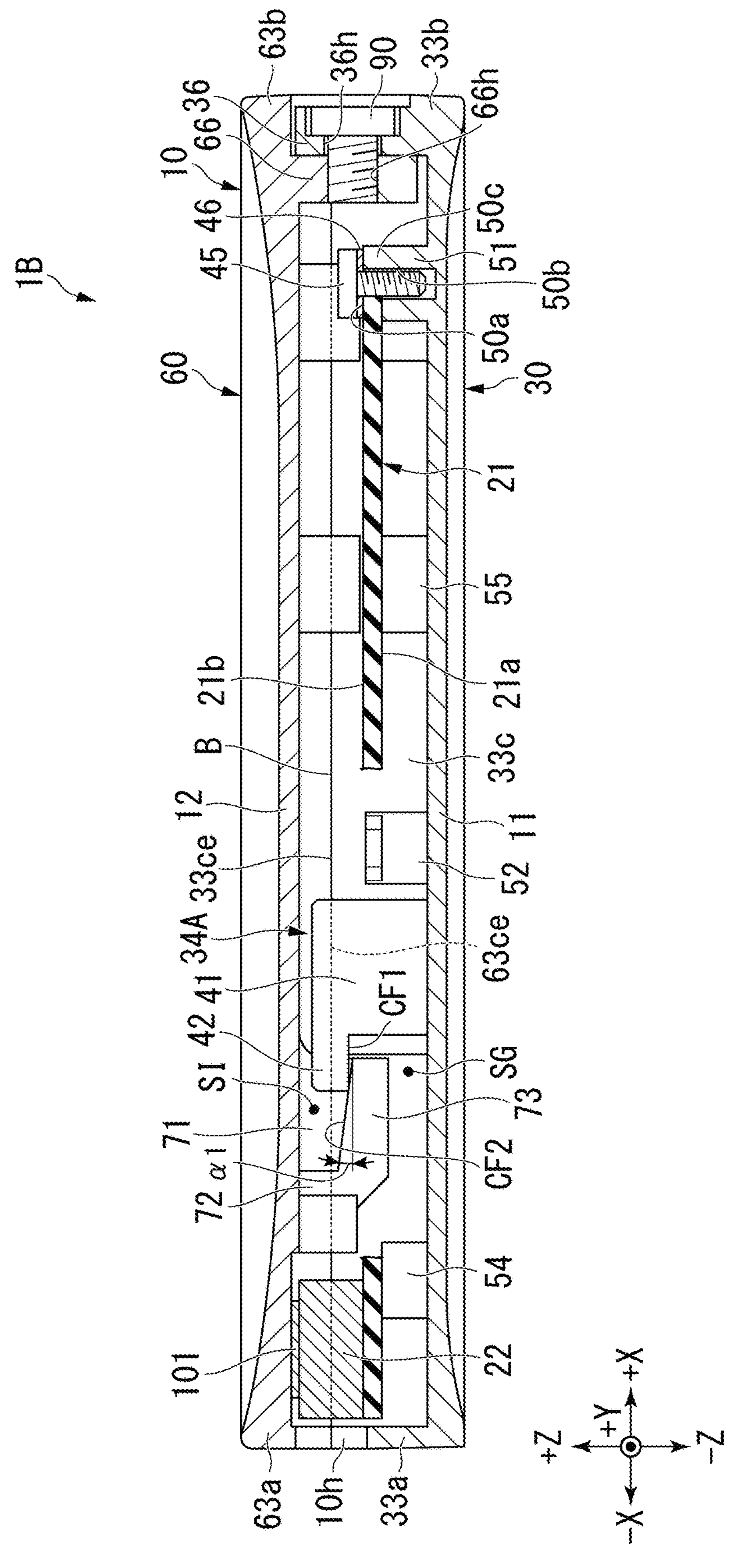
FIG. 14 is a cross-sectional view showing a semiconductor storage device according to a second modified example of the first embodiment.

FIG. 14 is a cross-sectional view showing a semiconductor storage device 1B of a second modified example. In the second modified example, a conductive member 101 is provided between the connection connector 22 and the second main wall 12. The conductive member 101 has flexibility and is held in a compressed state between the connection connector 22 and the second main wall 12. The conductive member 101 electrically connects the connection connector 22 and the second main wall 12. Therefore, it is possible to suppress unnecessary radiation related to the semiconductor storage device 1.

Second Embodiment

Next, a semiconductor storage device 1C according to a second embodiment will be described. The second embodiment differs from the first embodiment in an aspect related to shapes of the engagement portion 34 and the receiving portion 64. Note that, configurations other than those described below are the same as the configurations of the first embodiment.

(Shape of Engagement Portion)

Figure 15:
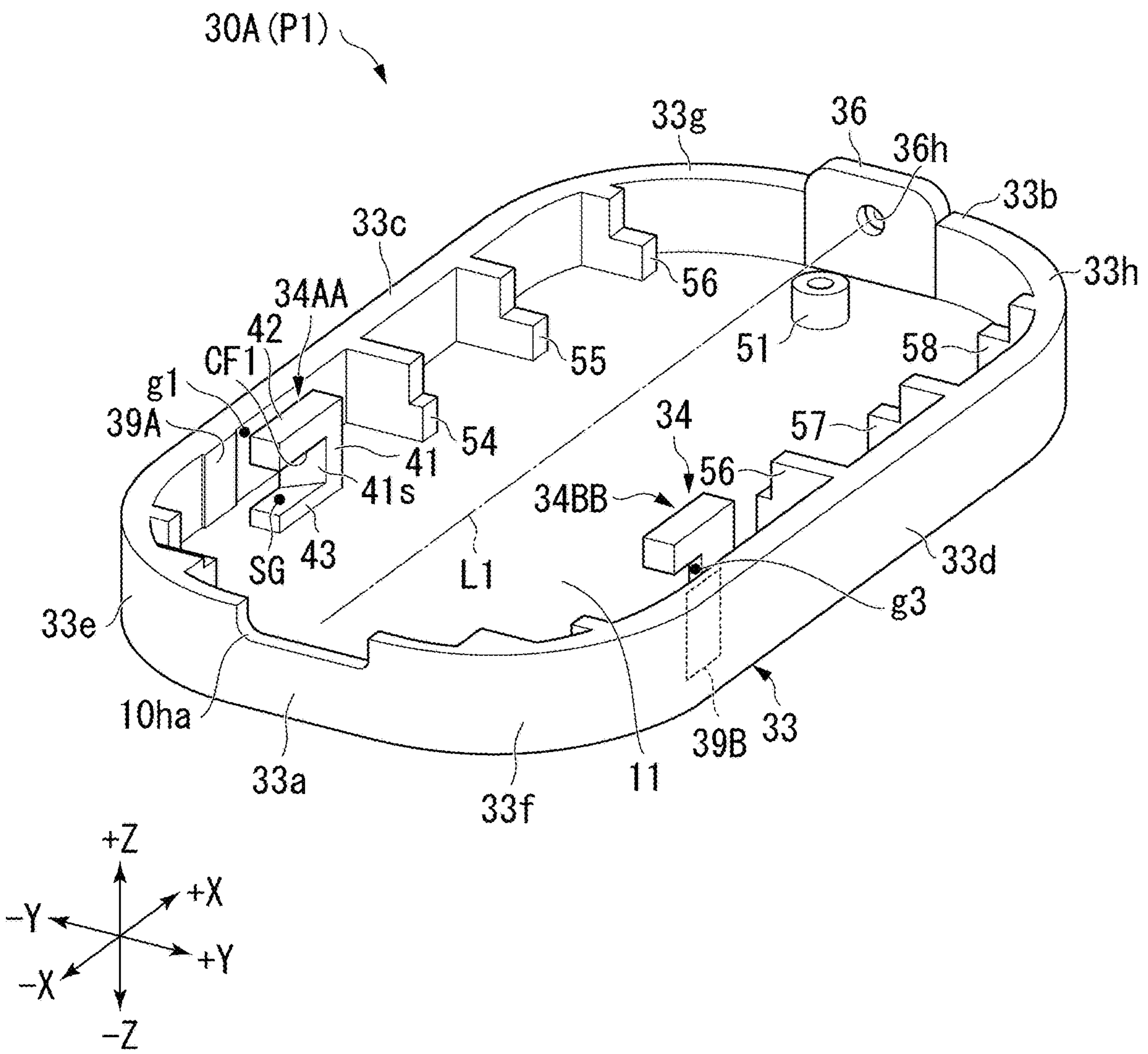
FIG. 15 is a perspective view showing a base according to a second embodiment.

FIG. 15 is a perspective view showing a base 30A according to the second embodiment. The base 30A has a first engagement portion 34AA and a second engagement portion 34BB. In the present embodiment, the first engagement portion 34AA and the second engagement portion 34BB have a shape that is bilaterally symmetrical with a virtual line L1 extending in the X direction through a center C1 of a first main wall 11 as a central line. Therefore, in the following, a shape of the first engagement portion 34AA will be described as a representative example. In description of the first engagement portion 34AA to be described below, a shape of the second engagement portion 34BB may be understood by replacing the "−Y direction" with the "+Y direction", replacing the "+Y direction" with the "−Y direction", and replacing a "first side wall 33*c*" with a "second side wall 33*d*".

In the present embodiment, the first engagement portion 34AA has a base portion 41, a protruding portion 42, and a pedestal portion 43. The pedestal portion 43 protrudes in the +Z direction from the first main wall 11. When viewed from the Z direction, the protruding portion 42 and the pedestal portion 43 have the same shape. In the present embodiment, a space SG is defined by a lower surface of the protruding portion 42 and an upper surface of the pedestal portion 43.

In the present embodiment, the base portion 41 has an inclined portion 41*s*. The inclined portion 41*s* extends in the Z direction across the protruding portion 42 and the pedestal portion 43. The inclined portion 41*s* is inclined with respect to the X direction so that inclined portion 41*s* is positioned further on the side in the −Y direction as it advances in the −X direction. In the present embodiment, the base portion 41, the protruding portion 42, and the pedestal portion 43 are formed by cutting one rectangular column portion included in a single-piece metal part P1. The inclined portion 41*s* is formed in an additional step using a cutting tool for forming the space SG between the protruding portion 42 and the pedestal portion 43. For example, in a case in which a rotary cutting tool is used as the cutting tool described above, the inclined portion 41*s* is formed in an arc shape along a rotation trajectory of the rotary cutting tool. According to such a configuration, it becomes easier to dispose the first engagement portion 34AA closer to the first side wall 33*c*.

(Shape of Receiving Portion)

Figure 16:
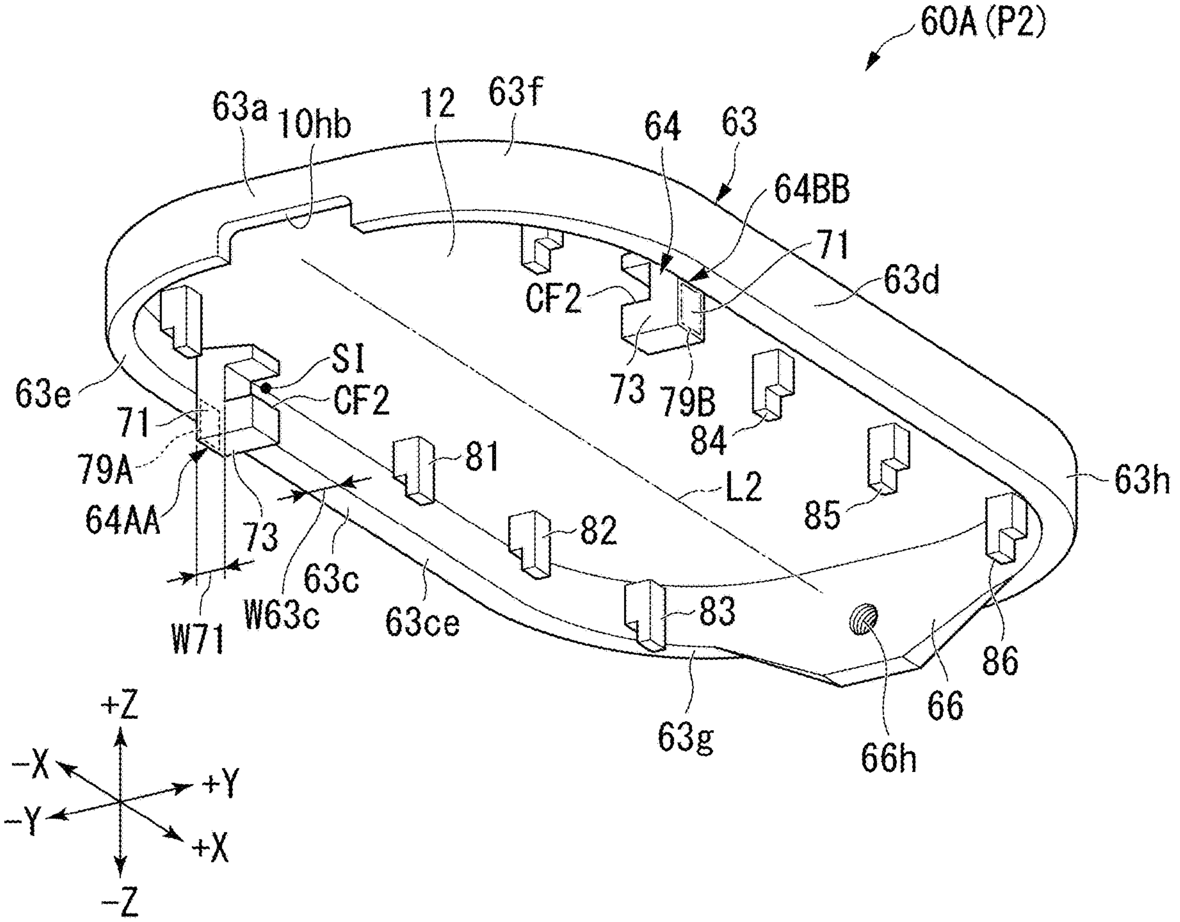
FIG. 16 is a perspective view showing a cover according to the second embodiment.

FIG. 16 is a perspective view showing a cover 60A according to the second embodiment. The cover 60A has a first receiving portion 64AA and a second receiving portion 64BB. In the present embodiment, the first receiving portion 64AA and the second receiving portion 64BB have a shape that is bilaterally symmetrical with a virtual line L2 extending in the X direction through a center C2 of a second main wall 12 as a central line. Therefore, in the following, a shape of the first receiving portion 64AA will be described as a representative example. In description related to a shape of the second receiving portion 64BB, description of the first receiving portion 64AA need only be read as follows. Specifically, the "−Y direction" need only be read as the "+Y direction". The "+Y direction" need only be read as the "−Y direction". The "first engagement portion 34AA" need only be read as the "second engagement portion 34BB". A "third side wall 63*c*" need only be read as a "fourth side wall 63*d*". A "lower end surface 63*ce* of the third side wall 63*c*" need only be read as a "lower end surface 63*de* of the fourth side wall 63*d*". A "first gap g1" need only be read as a "third gap g3". A "first guide surface 39A" need only be read as a "second guide surface 39B". A "first guide portion 79A" need only be read as a "second guide portion 79B".

The first receiving portion 64AA and the second receiving portion 64BB have a U shape compared to the first embodiment. With this shape, it is possible to provide the first receiving portion 64AA and the second receiving portion 64BB in a space smaller than that in the first embodiment. Also, phenomena such as occurrence of voids (formation of a large number of small cavities in a casting) during casting of the first receiving portion 64AA and the second receiving portion 64BB are less likely to occur.

In the present embodiment, the first receiving portion 64AA has a first base portion 71 and an extension portion 73. In the present embodiment, the second base portion 72 does not exist.

(First Base Portion)

The first base portion 71 extends in the −Z direction from the second main wall 12. At least a part of the first base portion 71 is adjacent to the third side wall 63*c* in the Y direction and is connected to the third side wall 63*c* in the Y direction. In the present embodiment, the first base portion 71 extends to the side in the −Z direction beyond the lower end surface 63*ce* of the third side wall 63*c* (a boundary portion B between the base 30A and the cover 60A). The first base portion 71 is a quadrangular column-shaped column portion extending in the X direction and the Y direction. A width W71 (for example, a maximum width) of the first base portion 71 in the Y direction is, for example, equal to or larger than the thickness W63*c* of the third side wall 63*c* in the Y direction. The first base portion 71 supports the extension portion 73 from the side in the −Y direction.

In the present embodiment, at least a part of the first base portion 71 is inserted into the first gap g1 between the first engagement portion 34AA and the first side wall 33*c*. The first base portion 71 has the guide portion 79A extending along an inner surface of the first side wall 33*c*. The guide portion 79A extends along, for example, the guide surface 39A of the first side wall 33*c*. In a process in which the base 30A and the cover 60A are combined, the guide portion 79A is guided by the guide surface 39A of the first side wall 33*c* to be slid in the +X direction.

(Extension Portion)

The extension portion 73 according to the present embodiment extends in the +Y direction from an end part of the first base portion 71 on the side in the −Z direction (see FIG. 16). At least a part of the extension portion 73 is positioned, for example, on the side in the −Z direction with respect to the lower end surface 63*ce* of the third side wall 63*c* (the boundary portion B between the base 30A and the cover 60A). The extension portion 73 is positioned apart from the second main wall 12. Between the extension portion 73 and the second main wall 12, an insertion space SI is defined by an upper surface of the extension portion 73 and a lower surface of the second main wall 12.

The insertion space SI on the side in the −Y direction is closed by the first base portion 71 (see FIG. 16). On the other hand, the insertion space SI on the side in the +Y direction is open to the inside of a housing 10 (see FIG. 16). In the present embodiment, the insertion space SI on the side in the −X direction and the side in the +X direction is open to the inside of the housing 10.

The protruding portion 42 of the first engagement portion 34AA is inserted into the insertion space SI from the side in the +X direction. The extension portion 73 is a portion facing the protruding portion 42 of the first engagement portion 34AA, which is inserted into the insertion space SI, from the side in the −Z direction. The extension portion 73 is a portion facing the protruding portion 42 of the first engagement portion 34AA, which is inserted into the insertion space SI, from the side opposite to the second main wall 12.

The extension portion 73 has a second contact portion CF2 exposed to the insertion space SI. The second contact portion CF2 comes into contact with a first contact portion CF1 of the protruding portion 42 when the protruding portion 42 of the first engagement portion 34AA is inserted into the insertion space SI. In the present embodiment, the first contact portion CF1 of the first engagement portion 34AA and the second contact portion CF2 of the first receiving portion 64AA come into contact with each other. Therefore, the first engagement portion 34AA and the first receiving portion 64AA engage with each other.

Figure 17:
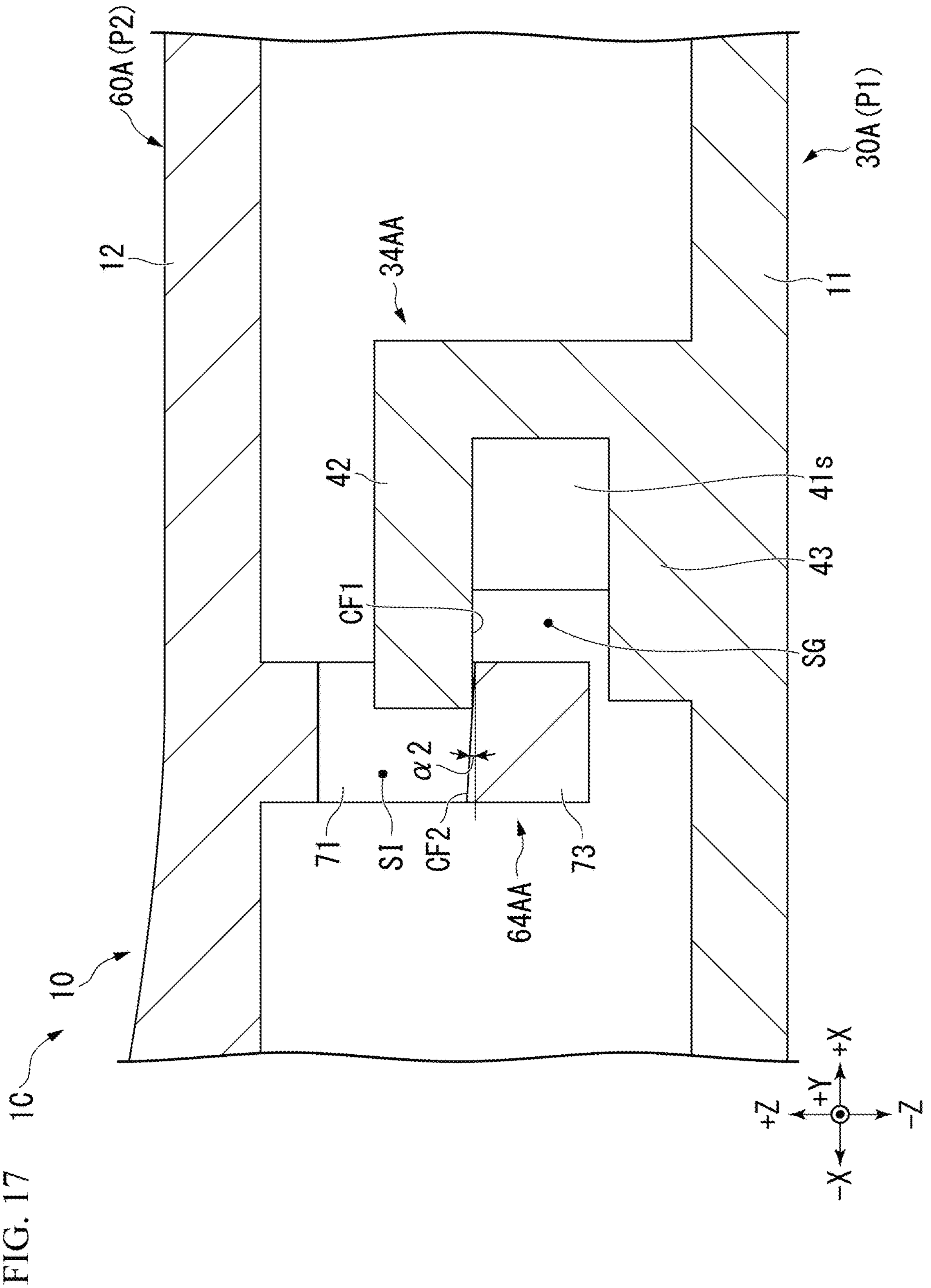
FIG. 17 is an enlarged cross-sectional view showing a part of a semiconductor storage device according to the second embodiment.

FIG. 17 is an enlarged cross-sectional view showing a part of the semiconductor storage device 1C according to the second embodiment. In the present embodiment, the second contact portion CF2 is inclined with respect to the X direction so that the second contact portion CF2 is positioned further on the side in the +Z direction as it advances in the −X direction. The second contact portion CF2 is inclined with respect to the X direction so that the insertion space SI becomes narrower in the −X direction. From another perspective, the second contact portion CF2 is inclined with respect to the X direction so that a contact force generated between the protruding portion 42 and the extension portion 73 increases as an amount of movement of the cover 60A in the +X direction with respect to the base 30A (an amount of movement in a direction in which the protruding portion 42 is inserted into the insertion space SI) increases.

Also, from another perspective, the second contact portion CF2 is inclined at a first angle $\alpha$2 with respect to the X direction so that the second contact portion CF2 is positioned further on the side in the +Z direction as it advances in the −X direction. On the other hand, the first contact portion CF1 is parallel to the X direction. Note that, alternatively, the first contact portion CF1 may be inclined at a second angle, which is different from the first angle $\alpha$2, with respect to the X direction. The second angle is, for example, an angle inclined with respect to the X direction so that the angle is positioned further on the side in the +Z direction as it advances in the −X direction, and is an angle smaller than the first angle $\alpha$2. Also, alternatively, instead of the above-described example, the first angle $\alpha$2 and the second angle may be the same angle.

Figure 18A:
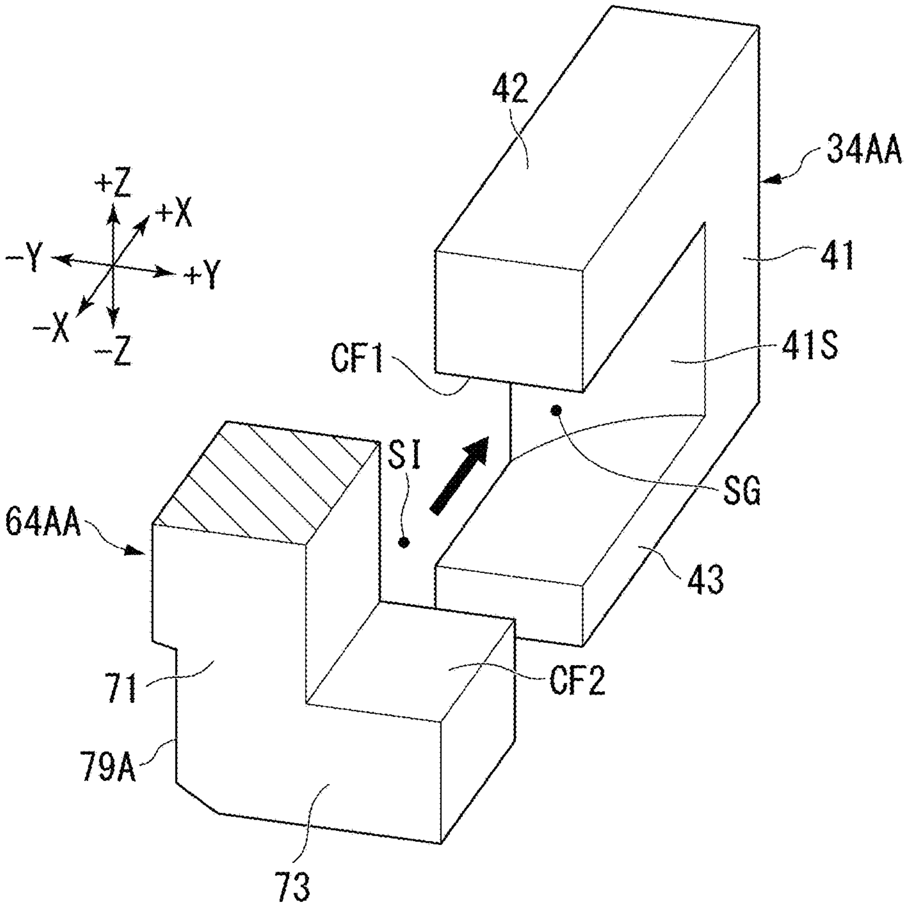
FIG. 18A is a perspective view for explaining a manufacturing method of the semiconductor storage device according to the second embodiment.
Figure 18B:
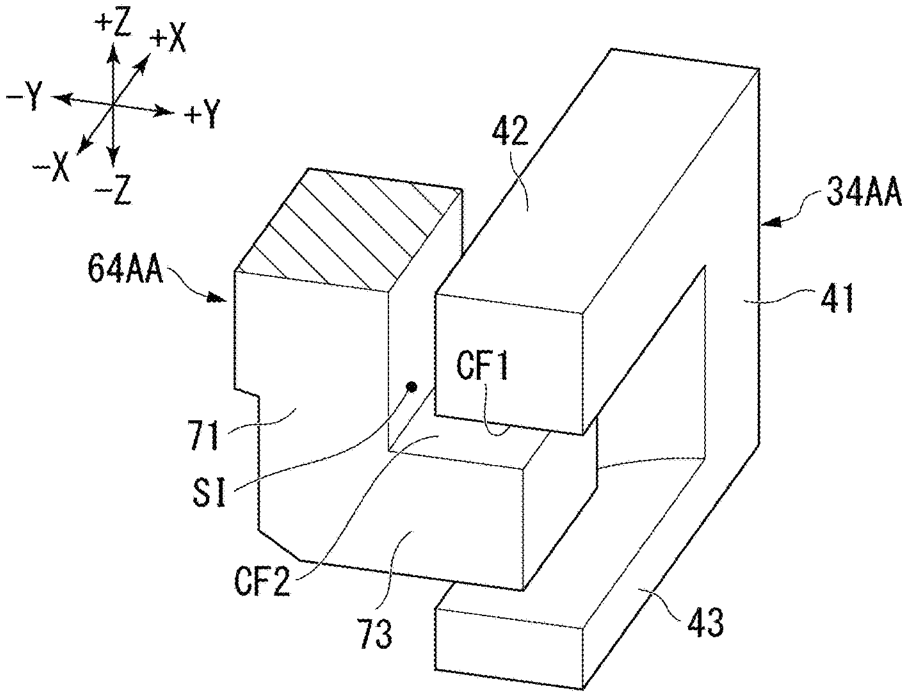
FIG. 18B is a perspective view for explaining a manufacturing method of the semiconductor storage device according to the second embodiment.

FIGS. 18A and 18B is a perspective view for explaining a manufacturing method of the semiconductor storage device 1C according to the second embodiment. Note that, for convenience of explanation, only the first engagement portion 34AA and the first receiving portion 64AA are extracted and shown in FIGS. 18A and 18B.

In the present embodiment, for example, similarly to the first embodiment, after a board unit 20 is fixed inside the base 30A, the cover 60A is placed on the base 30A in a state in which the cover 60A is displaced to the side in the −X direction with respect to the base 30A as shown in FIG. 18A. For example, the lower end surface 63*ce* of the third side wall 63*c* of the cover 60A is placed on an upper end surface 33*ce* of the first side wall 33*c* of the base 30A. A lower end surface 63*de* of the fourth side wall 63*d* of the cover 60A is placed on an upper end surface 33*de* of the second side wall 33*d* of the base 30A.

At this time, the guide portion 79A of the first receiving portion 64AA of the cover 60A extends along the guide surface 39A of the first side wall 33*c* of the base 30A. The guide portion 79B of the second receiving portion 64BB of the cover 60A extends along the guide surface 39B of the second side wall 33*d* of the base 30A. Therefore, positioning of the base 30A and the cover 60A in the Y direction takes place.

Next, as shown in FIG. 18B, the cover 60A is slid in the +X direction with respect to the base 30A. Therefore, the protruding portion 42 of the first engagement portion 34AA is inserted into the insertion space SI of the first receiving portion 64AA. The protruding portion 42 of the second engagement portion 34BB is inserted into the insertion space SI of the second receiving portion 64BB.

Next, the cover 60A is further slid in the +X direction with respect to the base 30A. Therefore, the first contact portion CF1 of the protruding portion 42 of the first engagement portion 34AA comes into contact with the second contact portion CF2 of the extension portion 73 of the first receiving portion 64AA, and the first engagement portion 34AA and the first receiving portion 64AA are engaged with each other. Similarly, the first contact portion CF1 of the protruding portion 42 of the second engagement portion 34BB comes into contact with the second contact portion CF2 of the extension portion 73 of the second receiving portion 64BB, and the second engagement portion 34BB and the second receiving portion 64BB are engaged with each other. Therefore, positioning of the base 30A and the cover 60A in the Z direction takes place.

According to such a configuration, as in the first embodiment, when the protruding portion 42 is inserted into the insertion space SI, an upper end of the protruding portion 42 comes into contact with an upper surface of the insertion space SI, a lower end of the protruding portion 42 comes into contact with a lower surface of the insertion space SI, and thereby a position of the cover 60A in the Z direction with respect to the base 30A becomes easier to be stably determined. Therefore, assembly of the semiconductor storage device 1C can be improved.

Also, according to such a configuration, a fastening member 90 is attached in a state in which the base 30A and the cover 60A are engaged with each other by the first engagement portion 34AA and the first receiving portion 64AA. Therefore, the number of fastening members 90 required to fasten the base 30A and the cover 60A can be reduced. Therefore, the number of parts in the semiconductor storage device 1C can be reduced. Also, if the number of required fastening members 90 can be reduced, the fastening member 90 exposed to the outside of the housing 10 becomes less visually noticeable, which makes it easier to improve a design of an external appearance of the semiconductor storage device 1C.

Some embodiments and modified examples have been described above. However, the embodiments and modified examples are not limited to the examples described above.

According to at least one of the embodiments described above, a semiconductor storage device includes a housing, a board, and a semiconductor memory. The housing has a first member and a second member. The first member has an engagement portion and a first fixing portion. The engagement portion is disposed inside the housing and includes a first portion extending in a thickness direction of the board and a second portion extending from the first portion in a first direction along a first surface. A fastening member is attached to the first fixing portion. The second member has a receiving portion and a second fixing portion. The receiving portion includes an insertion space that is open in a second direction opposite to the first direction, and engages with the engagement portion when the second member moves in the second direction with respect to the first member and the second portion is inserted into the insertion space. The second fixing portion is fixed to the first fixing portion by the fastening member with the engagement portion and the receiving portion engaged with each other. According to such a configuration, a reduction in the number of parts can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:

a housing having a housing space;

a board in the housing space, the board having a first surface; and a semiconductor memory on the first surface, wherein the housing includes a first member and a second member, the second member is combined with the first member, and the housing space is between the first member and the second member, the first member includes an engagement portion and a first fixing portion, the engagement portion is inside the housing and formed a gap with a first circumferential wall, the engagement portion includes a first portion and a second portion, the first portion extends in a thickness direction of the board, the second portion protrudes from the first portion in a first direction along the first surface, the first fixing portion to which a fastening member is attached, the second member includes a receiving portion and a second fixing portion, the receiving portion has first and second bases extended from a main wall; and an insertion space formed by the first and second bases and a third base, the insertion space is opened in a second direction opposite to the first direction, the receiving portion engages with the engagement portion when the second member moves in the second direction with respect to the first member and the second portion is thereby inserted into the insertion space, and the second fixing portion is fixed to the first fixing portion by the fastening member in a state in which the engagement portion and the receiving portion are engaged with each other.

2. The semiconductor storage device according to claim 1, wherein when a direction intersecting the first direction and the thickness direction of the board is defined as a third direction, the first member includes a first main wall, a first side wall, and a second side wall, the first main wall faces the board in the thickness direction of the board, the first side wall extends in the thickness direction of the board from an end part of the first main wall in the third direction, the second side wall extends in the thickness direction of the board from the other end part of the first main wall in the third direction, the first portion extends in the thickness direction of the board from the first main wall, and the second portion extends in the first direction from the first portion at a position apart from the first side wall and the second side wall.

3. The semiconductor storage device according to claim 2, wherein the second member includes the main wall, the main wall faces the board from a side opposite to the first main wall, and the receiving portion includes a fourth portion, the fourth portion extends in the third direction from the first base, and the fourth portion faces the second portion from a side opposite to the main wall.

4. The semiconductor storage device according to claim 3, wherein the fourth portion includes a contact portion, the contact portion comes into contact with the second portion, and the contact portion is inclined with respect to the first direction so that the insertion space becomes narrower in the first direction.

5. The semiconductor storage device according to claim 3, wherein the second portion includes a contact portion, the contact portion comes into contact with the fourth portion, and the contact portion is inclined with respect to the first direction so that the second portion becomes thicker in the second direction.

6. The semiconductor storage device according to claim 3, wherein the first base includes a first contact portion, the fourth portion includes a second contact portion, the second contact portion comes into contact with the first contact portion, one of the first contact portion and the second contact portion is inclined at a first angle with respect to the first direction, and the other of the first contact portion and the second contact portion is parallel to the first direction.

7. The semiconductor storage device according to claim 6, wherein the fastening member is a screw member in the first direction, the first fixing portion has an insertion hole through which the screw member is inserted, the second fixing portion is between the first fixing portion and the board, the second fixing portion has an engagement hole with which the screw member having passed through the insertion hole is engaged, and a force acting direction of the second member coincides with a movement direction of the second member, in the force acting direction of the second member, a force acts on the second member when the screw member rotates in a fastening direction, and in the movement direction of the second member, the second member moves with respect to the first member so that a contact force generated between the second portion and the fourth portion increases.

8. The semiconductor storage device according to claim 3, wherein the first base includes a first contact portion, the fourth portion includes a second contact portion, the second contact portion comes into contact with the first contact portion, one of the first contact portion and the second contact portion is inclined at a first angle with respect to the first direction, and the other of the first contact portion and the second contact portion is inclined at a second angle with respect to the first direction, the second angle is different from the first angle.

9. The semiconductor storage device according to claim 8, wherein the fastening member is a screw member in the first direction, the first fixing portion has an insertion hole through which the screw member is inserted, the second fixing portion is between the first fixing portion and the board, the second fixing portion has an engagement hole with which the screw member having passed through the insertion hole is engaged, and a force acting direction of the second member coincides with a movement direction of the second member, in the force acting direction of the second member, a force acts on the second member when the screw member rotates in a fastening direction, and in the movement direction of the second member, the second member moves with respect to the first member so that a contact force generated between the second portion and the fourth portion increases.

10. The semiconductor storage device according to claim 3, wherein the fourth portion faces the main wall, and the insertion space is sandwiched between the fourth portion and the main wall.

11. The semiconductor storage device according to claim 10, wherein the fourth portion includes a contact portion, the contact portion comes into contact with the second portion, the contact portion is inclined with respect to the first direction so that the insertion space becomes narrower in the first direction.

12. The semiconductor storage device according to claim 10, wherein the second portion includes a contact portion, the contact portion comes into contact with the fourth portion, and the contact portion is inclined with respect to the first direction so that the second portion becomes thicker in the second direction.

13. The semiconductor storage device according to claim 10, wherein a first gap is between the first side wall and the second portion, and at least a part of the first base is in the first gap.

14. The semiconductor storage device according to claim 13, wherein the first base includes a guide portion along an inner surface of the first side wall, and when the second member moves in the second direction with respect to the first member, the guide portion is guided by the inner surface of the first side wall and thereby moves in the second direction.

15. The semiconductor storage device according to claim 10, wherein the first member including the first main wall, the first side wall, the second side wall, and the engagement portion is a single-piece first part integrally molded by die casting, and the second member including the main wall and the receiving portion is a single-piece second part integrally molded by die casting.

16. The semiconductor storage device according to claim 3, wherein a first gap is between the first side wall and the second portion, and at least a part of the first base is in the first gap.

17. The semiconductor storage device according to claim 16, wherein the first base includes a guide portion along an inner surface of the first side wall, and when the second member moves in the second direction with respect to the first member, the guide portion is guided by the inner surface of the first side wall and thereby moves in the second direction.

18. The semiconductor storage device according to claim 3, wherein the first member including the first main wall, the first side wall, the second side wall, and the engagement portion is a single-piece first part integrally molded by die casting, and the second member including the main wall and the receiving portion is a single-piece second part integrally molded by die casting.

19. The semiconductor storage device according to claim 3, wherein the fourth portion faces the main wall, and the fourth portion is separated from the main wall by the insertion space.

20. The semiconductor storage device according to claim 1, wherein the housing further includes a first main wall facing the board, and the first main wall is curved to be recessed toward an inside of the housing.

* * * * *